US012575301B2

(12) United States Patent
Kim et al.

(10) Patent No.: US 12,575,301 B2
(45) Date of Patent: Mar. 10, 2026

(54) DISPLAY DEVICE

(71) Applicant: SAMSUNG DISPLAY CO., LTD.,
Yongin-si (KR)

(72) Inventors: Taegyun Kim, Hwaseong-si (KR);
Junhong Park, Suwon-si (KR); **Jun
Chun, Hwaseong-si (KR); Euisuk
Jung, Seoul (KR); Hyunyoung Jung**,
Hwaseong-si (KR)

(73) Assignee: SAMSUNG DISPLAY CO., LTD.,
Yongin-si (KR)

( * ) Notice: Subject to any disclaimer, the term of this
patent is extended or adjusted under 35
U.S.C. 154(b) by 359 days.

(21) Appl. No.: 17/904,469

(22) PCT Filed: Jul. 2, 2020

(86) PCT No.: PCT/KR2020/008668
§ 371 (c)(1),
(2) Date: Aug. 17, 2022

(87) PCT Pub. No.: WO2021/167180
PCT Pub. Date: Aug. 26, 2021

(65) Prior Publication Data
US 2023/0101692 A1 Mar. 30, 2023

(30) Foreign Application Priority Data

Feb. 21, 2020 (KR) ........................ 10-2020-0021468

(51) Int. Cl.
*H10K 59/80* (2023.01)
*G06F 3/044* (2006.01)
*H10K 59/40* (2023.01)

(52) U.S. Cl.
CPC ......... *H10K 59/879* (2023.02); *G06F 3/0446*
(2019.05); *H10K 59/40* (2023.02)

(58) Field of Classification Search
None
See application file for complete search history.

(56) References Cited

U.S. PATENT DOCUMENTS 9,349,780 B2 5/2016 Kim et al.
9,767,734 B2 9/2017 Jun et al.
(Continued)

FOREIGN PATENT DOCUMENTS

CN 109873089 6/2019
JP 2005-276620 10/2005
(Continued)

*Primary Examiner* — Andre L Matthews
(74) *Attorney, Agent, or Firm* — F. CHAU &
ASSOCIATES, LLC

(57) ABSTRACT
A display device includes a display panel, first and second
insulating layers, and a high refractive insulating layer. The
display panel includes emission areas and a non-emission
area. The first insulating layer is disposed on the display
panel, and first openings are defined in the first insulating
layer. Second openings, corresponding to the first openings,
are defined in the second insulating layer having a refractive
index greater than that of the first insulation layer. The high
refractive insulating layer has a refractive index greater than
that of the second insulating layer. The high refractive
insulating layer is disposed on the first and second insulating
layers. The first insulating layer includes a first inclined
surface defining the first openings, and the second insulating
layer includes a second inclined surface defining the second
openings. The first inclined surface and the second inclined
surface are spaced apart from each other.

24 Claims, 15 Drawing Sheets

(56)                    References Cited

U.S. PATENT DOCUMENTS

| | | | | |
|---|---|---|---|---|
| 10,388,913 | B2 | 8/2019 | Jung et al. | |
| 10,568,578 | B2 | 2/2020 | Sakamoto et al. | |
| 10,622,620 | B2 | 4/2020 | Yoon et al. | |
| 10,644,083 | B2 | 5/2020 | Lee et al. | |
| 10,971,702 | B2 | 4/2021 | Kim et al. | |
| 11,066,561 | B2 | 7/2021 | Park et al. | |
| 2017/0125740 | A1* | 5/2017 | Lee | H10K 59/877 |
| 2017/0279084 | A1* | 9/2017 | Sakamoto | H10K 59/873 |
| 2018/0138458 | A1* | 5/2018 | Tokuda | H10K 50/86 |
| 2019/0013495 | A1* | 1/2019 | Kim | H10K 59/8051 |
| 2019/0051711 | A1* | 2/2019 | Lee | H10K 59/8792 |
| 2019/0115404 | A1* | 4/2019 | Moon | H10K 59/122 |
| 2019/0165061 | A1 | 5/2019 | Jung et al. | |
| 2020/0279896 | A1 | 9/2020 | Cao | |
| 2022/0107700 | A1* | 4/2022 | Kim | G06F 3/0412 |

FOREIGN PATENT DOCUMENTS

| | | |
|---|---|---|
| KR | 10-2014-0085243 | 7/2014 |
| KR | 10-2016-0089923 | 7/2016 |
| KR | 10-2017-0091 | 8/2017 |
| KR | 10-1928646 | 12/2018 |
| KR | 10-2019-0004863 A | 1/2019 |
| KR | 10-2019-0016635 | 2/2019 |
| KR | 10-2019-0062678 A | 6/2019 |
| KR | 10-2019-0090485 | 8/2019 |

* cited by examiner

DISPLAY DEVICE

CROSS-REFERENCE TO RELATED APPLICATIONS

This U.S. non provisional patent application is a National Stage application, file under 35 U.S.C. § 371, of International Patent Application No. PCT/KR2020/008668, filed on Jul. 2, 2020, which claims priority to Korean Patent Application No 10-2020-0021468, filed on Feb. 21, 2020, the entire contents of which are hereby incorporated by reference.

TECHNICAL FIELD

The present invention relates to a display device, and more particularly, to a display device having a high refractive insulating layer.

DISCUSSION OF THE RELATED ART

A display device may be classified as either a self-luminous display device, in which a light emitting element emits light by itself, or a light-receiving display device in which transmittance of received light is controlled. The self-luminous display device may be, for example, an organic light emitting display device. Light generated from an emission layer of the organic light emitting display device may be emitted, not only in a frontward direction, but also in a lateral direction. Emission efficiency may be determined based on the light emitted in the frontward direction. For example, the light emitted in the lateral direction may cause a decrease in emission efficiency.

SUMMARY

A display device includes a display panel, a first insulating layer, a second insulating layer, and a high refractive insulating layer.

The display panel includes a plurality of emission areas and a non-emission area defined between the plurality of emission areas. The first insulating layer is disposed on the display panel and has a first refractive index. A plurality of first openings overlapping the plurality of emission areas are defined in the first insulating layer. The second insulating layer has a second refractive index, and a plurality of second openings corresponding to the plurality of first openings are defined in the second insulating layer. The high refractive insulating layer is disposed on the first and second insulating layers and overlaps the plurality of emission areas. The high refractive insulating layer has a third refractive index that is greater than each of the first and second refractive indexes.

The first insulating layer includes a first inclined surface that defines the plurality of first openings, and the second insulating layer includes a second inclined surface that defines the plurality of second openings. The first inclined surface and the second inclined surface are spaced apart from each other.

A display device includes a display panel and an input sensing unit. The display panel includes a plurality of pixels, each of which is provided with a light emitting element that emits light to display an image, and a thin film encapsulation layer that covers the plurality of pixels. The input sensing unit is disposed directly on the thin film encapsulation layer.

The display panel includes a plurality of emission areas corresponding to the light emitting element and a non-emission area defined between the emission areas, and the input sensing unit includes a first insulating layer, a second insulating layer, and a high refractive insulating layer. The first insulating layer has a first refractive index, and a plurality of first openings overlapping the plurality of emission areas are defined in the first insulating layer. The second insulating layer has a second refractive index, and a plurality of second openings corresponding to the plurality of first openings are defined in the second insulating layer. The high refractive insulating layer is disposed on the first, second insulating layers and overlaps the plurality of emission areas, and has a third refractive index that is greater than each of the first and second refractive indexes.

The first insulating layer includes a first inclined surface that defines the plurality of first openings, and the second insulating layer includes a second inclined surface that defines the plurality of second openings. The first inclined surface and the second inclined surface are spaced apart from each other.

BRIEF DESCRIPTION OF THE DRAWINGS

FIG. 6 is a cross-sectional view of the display device, taken along line II-II' of FIG. 5B according to an embodiment of the present invention.

FIG. 8 is a cross-sectional view of a display device, taken along line II-II' of FIG. 5B according to an embodiment of the present invention.

FIG. 11 is a cross-sectional view of the display device, taken along line III-III' of FIG. 10 according to an embodiment of the present invention.

FIG. 12 is a cross-sectional view illustrating a partial configuration of the display device according to an embodiment of the present invention.

FIG. 13 is a cross-sectional view illustrating a partial configuration of the display device according to an embodiment of the present invention.

DETAILED DESCRIPTION OF THE DRAWINGS

Figure 1A:
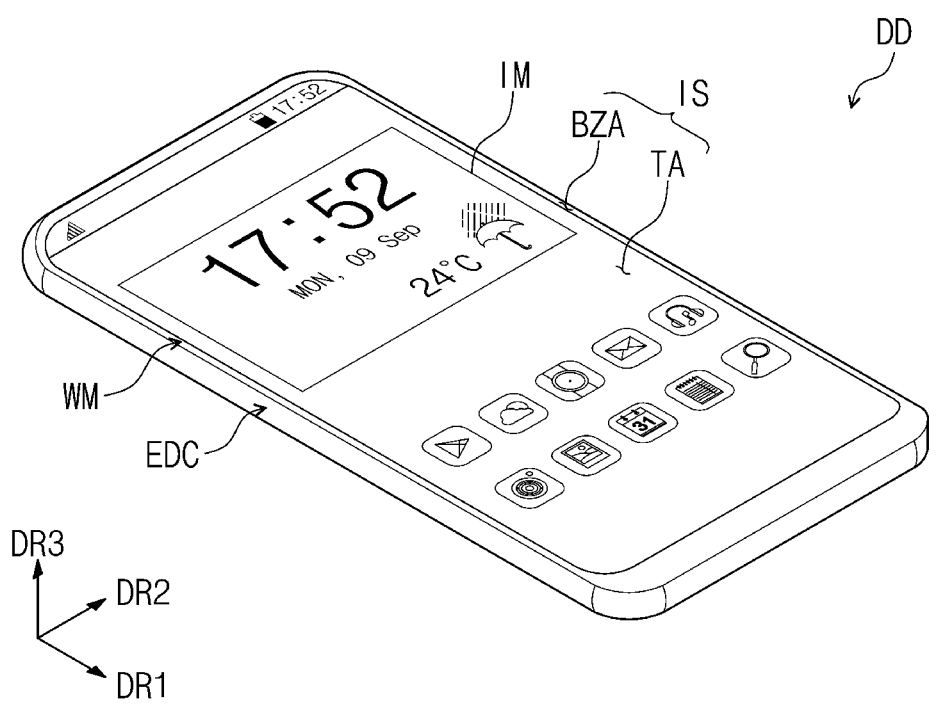
FIG. 1A is a perspective view of a display device according to an embodiment of the present invention.

In this specification, it will also be understood that when one component (or area, layer, portion) is referred to as being 'on', 'connected to', or 'coupled to' another component, it can be disposed directly/connected/coupled on/to the one component, or an intervening third component may also be present.

Like reference numerals may refer to like elements throughout the specification and the drawings. Also, in the figures, the thickness, ratio, and dimensions of components may be exaggerated for clarity of illustration.

The term "and/or" includes any and all combinations of one or more of the associated listed items.

It will be understood that although the term such as 'first' and 'second' are used herein to describe various elements, these elements should not necessarily be limited by these terms. The terms are used to distinguish one component from other components. For example, a first element referred to as a first element in an embodiment can be referred to as a second element in another embodiment without departing from the scope of the disclosure. The terms of a singular form may include plural forms unless referred to the contrary.

Also, "under", "below", "above", "upper", and the like are used for explaining relation association of components illustrated in the drawings. The terms may be a relative concept and described based on directions expressed in the drawings.

The meaning of "include" or "comprise" specifies a property, a fixed number, a step, an operation, an element, a component or a combination thereof, but does not exclude other properties, fixed numbers, steps, operations, elements, components or combinations thereof.

Hereinafter, embodiments of the present invention will be described with reference to the accompanying drawings.

Figure 1B:
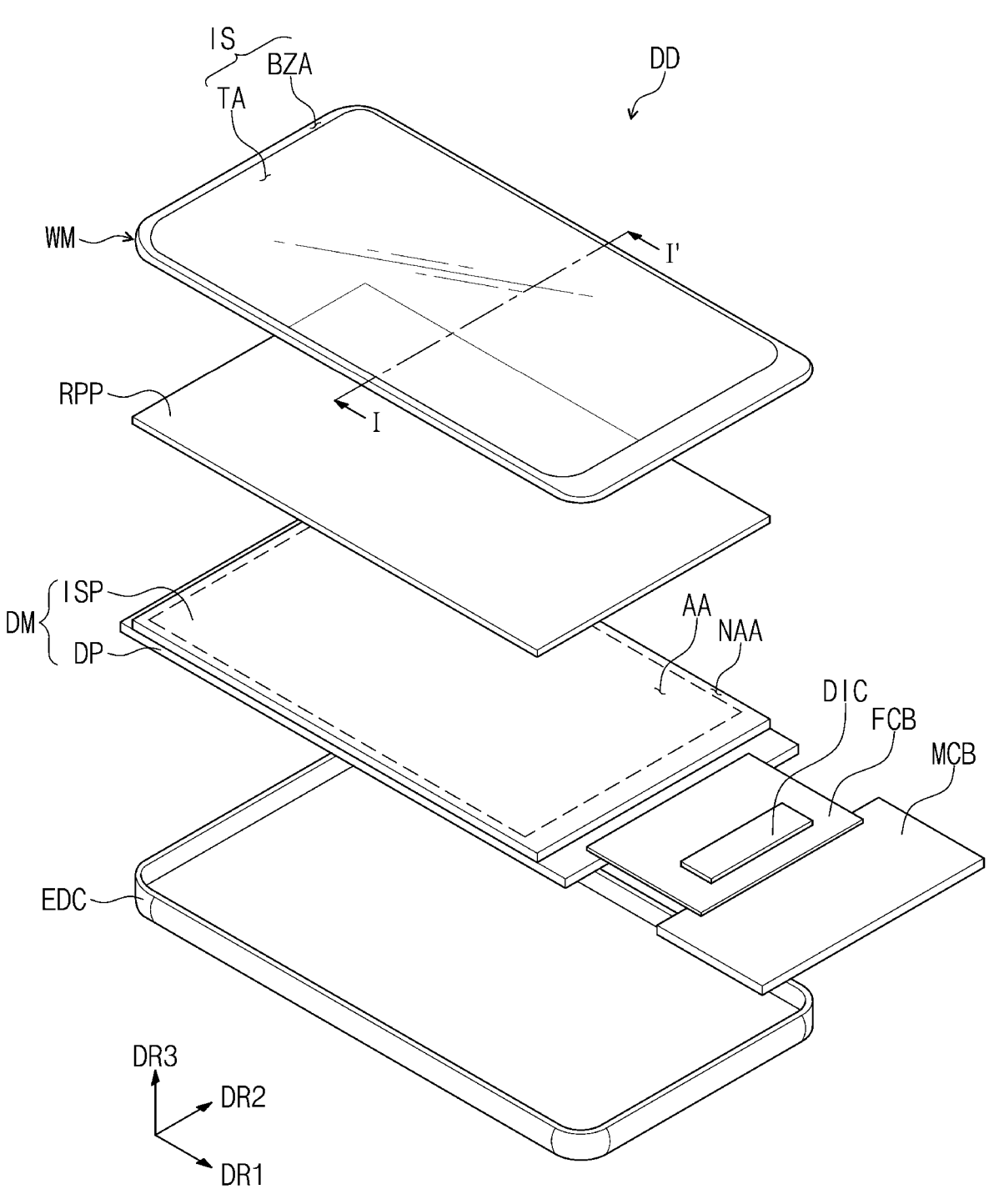
FIG. 1B is an exploded perspective view of the display device according to an embodiment of the present invention.
Figure 2A:
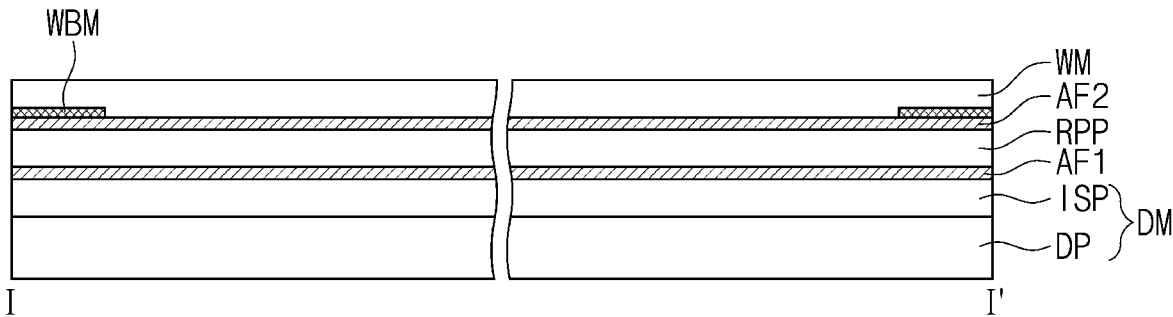
FIG. 2A is a cross-sectional view of the display device taken along line I-I' of FIG. 1B.
Figure 2B:
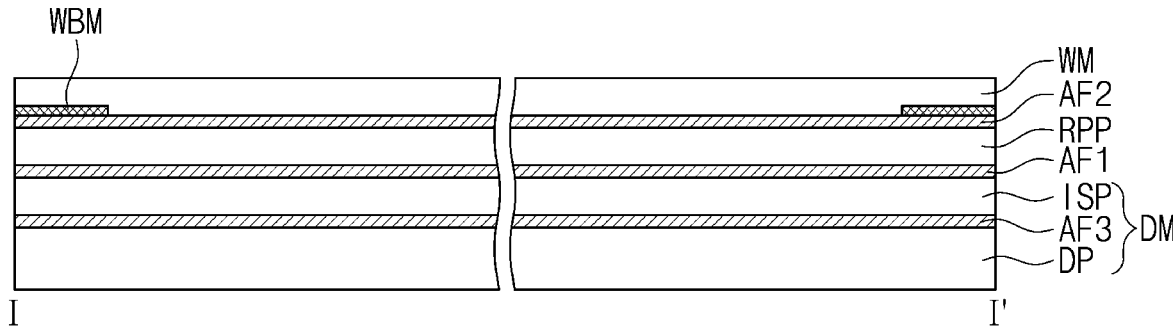
FIG. 2B is a cross-sectional view of the display device according to an embodiment of the present invention.
Figure 2C:
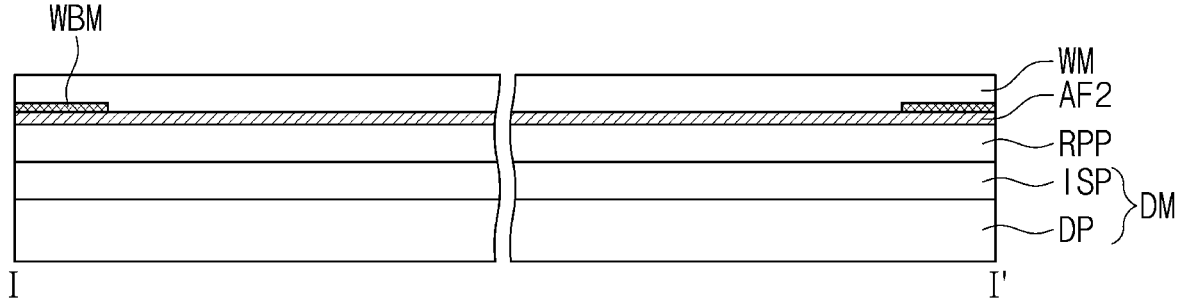
FIG. 2C is a cross-sectional view of the display device according to an embodiment of the present invention.

FIG. 1A is a perspective view of a display device according to an embodiment of the present invention, and FIG. 1B is an exploded perspective view of the display device according to an embodiment of the present invention. FIG. 2A is a cross-sectional view taken along line I-I' of FIG. 1B, FIG. 2B is a cross-sectional view of the display device according to an embodiment of the present invention, and FIG. 2C is a cross-sectional view of the display device according to an embodiment of the present invention.

Referring to FIGS. 1A to 2B, a display device DD may be a device that is activated according to an electrical signal. The display device DD may include various embodiments. For example, the display device DD may be applied to electronic devices such as a smart watch, a tablet, a notebook, a computer, a smart television, and the like.

The display device DD may display an image IM in a third direction DR3 on a display surface IS that is parallel to each of a first direction DR1 and a second direction DR2. The display surface IS on which the image IM is displayed may correspond to a front surface of the display device DD. The image IM may include a still image as well as a dynamic image.

In this embodiment, a front surface (or a top surface) or a rear surface (or a bottom surface) of each element may be defined based on a direction in which die image IM is displayed. The front and rear surfaces may be opposite to each other in the third direction DR3. A normal direction of each of the front and rear surfaces may be parallel to the third direction DR3.

A spaced distance between the front and rear surfaces in the third direction DR3 may correspond to a thickness of the display device DD in the third direction DR3. The directions indicated as the first to third directions DR1, DR2, and DR3 may be a relative concept and thus changed into different directions.

The display device DD may sense an external input. The external input may include various types of inputs provided from the outside of the display device DD. The external input may be provided in various manners.

For example, the external input may include an external input (for example, hovering) applied to be proximate to or adjacent by a predetermined distance to the display dev ice DD as well as to contact a portion of the human body such as the user's hand. In addition, the external input may include various types such as force, a pressure, a temperature, light, and the like.

The front surface of the display device DD may be divided into a transmission area TA and a bezel area BZA. The transmission area TA may be an area on which the image IM is displayed. A user may see the image IM through the transmission area TA. In this embodiment, each corner of the transmission area TA may have a rounded rectangular shape. However, this is merely an example. For example, the electronic device DD may have various shapes and is not necessarily limited to any one embodiment.

The bezel area BZA is adjacent to the transmission area TA. The bezel area BZA may have a predetermined color. The bezel area BZA may at least partially surround the transmission area TA. Thus, the shape of the transmission area TA may be substantially defined by the bezel area BZA. However, this is merely an example. For example, the bezel area BZA may be disposed adjacent to only one side of the transmission area TA or may be omitted. The display device DD, according to an embodiment of the present invention, may be implemented according to various embodiments, but is not necessarily limited to a specific embodiment.

As illustrated in FIGS. 1B and 2A, the display device DD may include a window WM, an anti-reflection unit RPP, a display module DM, and an external case EDC. The display module DM may include a display panel DP and an input sensing unit ISP.

The window WM may be made of a transparent material that is capable of emitting an image therethrough. For example, the window WM may be made of glass, sapphire, plastic, and the like. Although the window WM is provided as a single layer, the embodiment of the present invention is not necessarily limited thereto. The window WM may include a plurality of layers. The bezel area BZA of the above-described display device DD may be substantially provided as an area on which a material having a predetermined color is printed on one area of the window WM. As an example of the present invention, the window WM may include a light blocking pattern WBM for defining the bezel area BZA. The light blocking pattern WBM may be a colored organic film, for example, formed in a coating manner.

The display panel DP, according to an embodiment of the present invention, may be an emission-type display panel, but is not necessarily limited thereto. For example, the display panel DP may be an organic light emitting display panel and a quantum-dot light emitting display panel. A light emitting layer of the organic light emitting display panel may include an organic light emitting material. A light emitting layer of the quantum dot light emitting display panel may include a quantum dot, a quantum rod, and the like. Hereinafter, the organic light emitting display panel will be described as an example of the display panel DP.

Referring to FIG. 2A, the input sensing unit ISP may be disposed directly on the display panel DP. According to an embodiment of the present invention, the input sensing unit ISP may be disposed on the display panel DP through a continuous process. For example, when the input sensing unit ISP is disposed directly on the display panel DP, an adhesive film might not be disposed between the input sensing unit ISP and the display panel DP. However, the embodiment of the present invention is not necessarily limited thereto. For example, as illustrated in FIG. 2B, an adhesive film AF3 (hereinafter, referred to as a third adhesive film) may be disposed between the input sensing unit ISP and the display panel DP. In this case, the input sensing unit ISP might not be manufactured together with the display panel DP by the continuous process. Thus, after being manufactured through a separate process from the process of forming the display panel DP, the input sensing unit ISP may be fixed to a top surface of the display panel DP by the third adhesive film AF3.

The display panel DP generates an image, and the input sensing unit ISP acquires coordinate information of an external input (for example, a touch event).

The anti-reflection unit RPP reduces reflectance of external light incident from an upper side of the window WM. The anti-reflection unit RPP, according to an embodiment of the present invention, may include a phase retarder and a polarizer. The phase retarder may be a film type or liquid crystal coating type retarder and may include a $\lambda/2$ phase retarder (e.g., a half wave plate) and/or a $\lambda/4$ phase retarder (e.g., a quarter wave plate). The polarizer may also be provided in a film type or liquid crystal coating type polarizer. The film type may include an elongation-type synthetic resin, and the liquid crystal coating type may include liquid crystals that are arranged in a predetermined arrangement. The phase retarder and the polarizer may be implemented as one polarizing film. The anti-reflection unit RPP may further include a protective film disposed above or below the polarizing film.

The anti-reflection unit RPP may be disposed on the input sensing unit ISP. For example, the anti-reflection unit RPP may be disposed between the input sensing unit ISP and the window WM. The input sensing unit ISP, the anti-reflection unit RPP, and the window WM may be coupled to each other through adhesive films. A first adhesive film AF1 is disposed between the input sensing unit ISP and the anti-reflection unit RPP, and a second adhesive film AF2 is disposed between the anti-reflection unit RPP and the window WM. Thus, the anti-reflection unit RPP is coupled to the input sensing unit ISP by the first adhesive film AF1, and the window WM is coupled to the anti-reflection unit RPP by the second adhesive film AF2.

As an example of the present invention, each of the first to third adhesive films AF1 to AF3 may include an optically clear adhesive film (OCA). However, each of the first to third adhesive films AF1 to AF3 are not necessarily limited thereto and may include an ordinary adhesive or pressure-sensitive adhesive. For example, the first to third adhesive films AF1 to AF3 may include an optically clear adhesive resin (OCR) or a pressure sensitive adhesive film (PSA).

Although the structure in which the anti-reflection unit RPP is fixed to the input sensing unit ISP by the first adhesive film AF1 is illustrated in FIGS. 2A and 2B, the present invention is not necessarily limited thereto. For example, as illustrated in FIG. 2C, the anti-reflection unit RPP may be formed on the input sensing unit ISP by the continuous process. In this case, the anti-reflection unit RPP may include color filters disposed directly on the input sensing unit ISP without including the polarizing film. When the anti-reflection unit RPP includes the color filters disposed directly on the input sensing unit ISP, the first adhesive film AF1 may be omitted. The anti-reflection unit RPP may further include a black matrix adjacent to the color filters.

The display module DM may display an image according to an electrical signal and transmit/receive information on the external input. The display module DM may define an active area AA and a peripheral area NAA. The active area AA may be defined as an area that emits the image provided from the display module DM.

The peripheral area NAA is adjacent to the active area AA. For example, the peripheral area NAA may at least partially surround the active area AA. However, this is merely an example. For example, the peripheral area NAA may have various shapes and is not necessarily limited to a specific embodiment. According to embodiments, the active area AA of the display module DM may correspond to at least a portion of the transmission area TA.

The display module DM may further include a main circuit board MCB, a flexible circuit film FCB, and a driving chip DIC.

The main circuit board MCB may be connected to the flexible circuit board FCB and electrically connected to the display panel DP. The main circuit board MCB may include a plurality of driving elements. The plurality of driving elements may include a circuit unit for driving the display panel DP.

The flexible printed circuit board FCB is connected to the display panel DP to electrically connect the display panel DP to the main circuit board MCB. The driving chip DIC may be mounted on the flexible circuit film FCB.

The driving chip DIC may include driving elements for driving pixels of the display panel DP, for example, a data driving circuit. Tire flexible circuit film FCB, according to an embodiment of the present invention, is illustrated as one film, but is not necessarily limited thereto. For example, the flexible circuit film FCB may be provided in plural and connected to the display panel DP.

FIG. 1B illustrates a structure in which the driving chip DIC is mounted on the flexible circuit film FCB, but the embodiment of the present invention is not necessarily limited thereto. For example, the driving chip DIC may be directly mounted on the display panel DP. In this case, a portion of the display panel DP, on which the driving chip DIC is mounted, may be bent to be disposed on a rear surface of the display module DM.

The input sensing layer ISP may be electrically connected to the main circuit board MCB through the flexible circuit film FCB. However, the embodiment of the present invention is not necessarily limited thereto. For example, the display module DM may additionally include a separate flexible circuit film for electrically connecting the input sensing unit ISP to the main circuit board MCB.

The external case EDC accommodates the display module DM. The external case EDC may be bonded to the window WM to define an outer appearance of the display device DD. The external case EDC absorbs an external impact and prevents foreign substances/moisture from being permeated into the display module DM to protect the components accommodated in the external case EDC. As an example of an embodiment of the present invention, the external case EDC may be provided in a shape in which a plurality of accommodation members are bonded to each other.

The display device DD, according to an embodiment, includes an electronic module including various functional modules for driving the display module DM, a power supply module for supplying power required for the overall operation of the display device DD, and a bracket bonded to the display module DM and or the external case EDC to divide an internal space of the display device DD.

Figure 3:
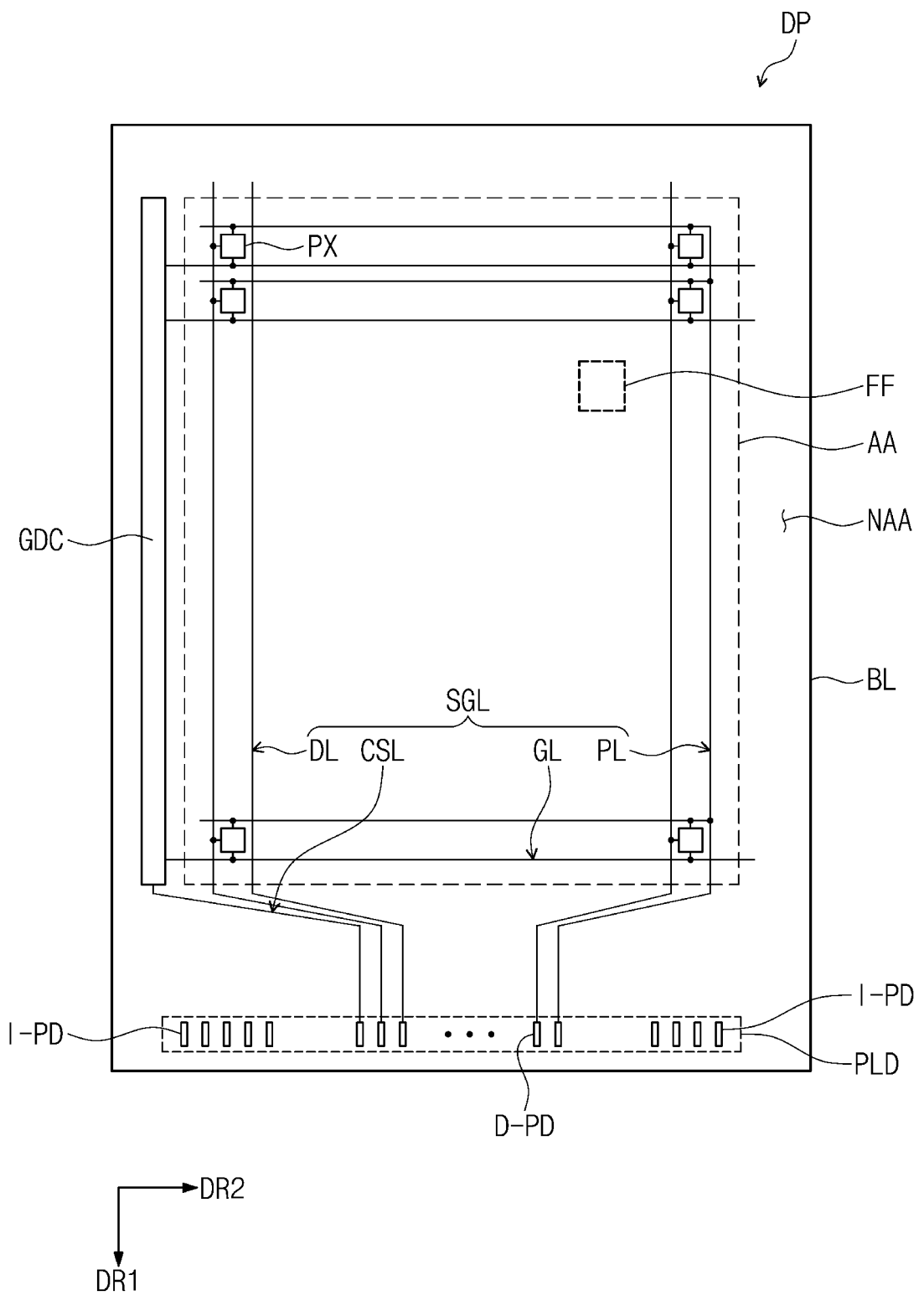
FIG. 3 is a plan view of the display panel according to an embodiment of the present invention.
Figure 4:
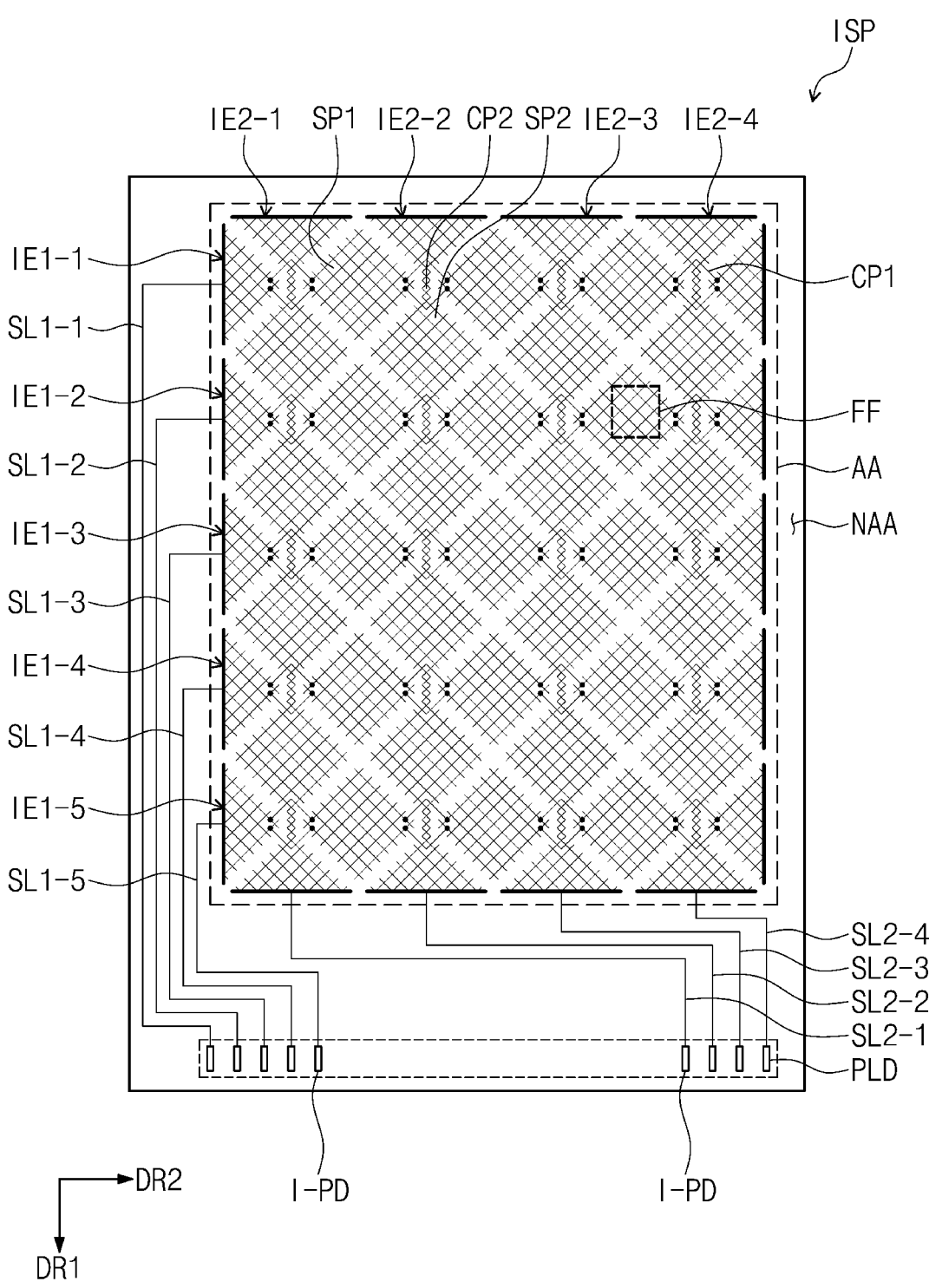
FIG. 4 is a plan view of an input sensing unit according to an embodiment of the present invention.

FIG. 3 is a plan view of the display panel according to an embodiment of the present invention, and FIG. 4 is a plan view of an input sensing unit according to an embodiment of the present invention.

Referring to FIGS. 3 and 4, the display panel DP may include a driving circuit GDC, a plurality of signal lines SGL, and a plurality of pixels PX. The display panel DP may further include a pad part PLD disposed on the peripheral area NAA. The pad part PLD includes pixel pads D-PD connected to corresponding signal lines among the plurality of signal lines SGL.

The pixels PX are disposed on the active area AA. Each of the pixels PX includes an organic light emitting diode OLED (see FIG. 6) and a pixel driving circuit connected to the organic light emitting diode OLED. The driving circuit GDC, the signal lines SGL, the pad part PLD, and the pixel driving circuit may be provided in a circuit element layer DP-CL illustrated in FIG. 6.

The driving circuit GDC may include a gate driving circuit. The gate driving circuit generates a plurality of gate signals (hereinafter, referred to as gate signals) and sequentially outputs the gate signals to a plurality of gate lines GL (hereinafter, referred to as gate lines) to be described later. The gate driving circuit may further output another control signal to the pixel driving circuit.

The signal lines SGL include gate lines GL, data lines DL, a power line PL, and a control signal line CSL. One gate line of the gate lines GL is connected to a corresponding pixel PX among the pixels PX, and one data line of the data lines DL is connected to a corresponding pixel among the pixels PX. The power line PL is connected to the pixels PX. The control signal line CSL may provide control signals to the driving circuit GDC. The signal lines SGL overlap the active area AA and the peripheral area NAA.

The pad part PLD may be a portion to which the flexible circuit film FCB (see FIG. 1B) is connected and may include the pixel pads D-PD configured to connect the flexible circuit film FCB to the display panel DP and input pads I-PD configured to connect the flexible circuit film FCB to the input sensing unit ISP. The pixel pads D-PD and the input pads I-PD may be provided by exposing some of lines disposed in the circuit element layer DP-CL from the insulating layer provided in the circuit element layer DP-CL.

The pixel pads D-PD are connected to the corresponding pixels PX through the signal lines SGL, respectively. Also, the driving circuit GDC may be connected to any one of the pixel pads D-PD.

Referring to FIG. 4, the input sensing unit ISP, according to an embodiment of the present invention, may include first sensing electrodes IE1-1 to IE1-5, first signal lines SL1-1 to SL1-5 connected to the first sensing electrodes IE1-1 to IE1-5, second sensing electrode IE2-1 to IE2-4, and second signal lines SL2-1 to SL2-4 connected to the second sensing electrodes IE2-1 to IE2-4. As an example of the present invention, the input sensing unit ISP may further include third signal lines connected to the second sensing electrodes IE2-1 to IE2-4. In this case, the second signal lines SL2-1 to SL2-4 are connected to one end of each of the second sensing electrodes IE2-1 to IE2-4, and the third signal lines are connected to the other end of each of the second sensing electrodes IE2-1 to IE2-4.

The first sensing electrodes IE1-1 to IE1-5 and the second sensing electrodes IE2-1 to IE2-4 cross each other. The first sensing electrodes IE1-1 to IE1-5 are arranged in the first direction DR1, and each of the first sensing electrodes IE1-1 to IE1-5 extends in the second direction DR2.

Each of the first sensing electrodes IE1-1 to IE1-5 includes first sensor parts SP1 and first connection parts CP1, which are disposed in the active area AA. Each of the second sensing electrodes IE2-1 to IE2-4 includes second sensor parts SP2 and second connection parts CP2, which are disposed in the active area AA. Each of two first sensor parts disposed at both ends of the first electrode among the first sensor parts SP1 may have a smaller size, for example, have a size corresponding to about ½ of a size of the first sensor part disposed at a center. Each of two second sensor parts disposed at both ends of the second electrode among the second sensor pails SP2 may have a smaller size, for example, have a size corresponding to about ½ of a size of the second sensor part disposed at a center.

FIG. 4 illustrates the first sensing electrodes IE1-1 to IE1-5 and die second sensing electrodes IE2-1 to IE2-4 according to an embodiment, but the shape of each of the sensing electrodes is not necessarily limited thereto. In an embodiment of the present invention, the first sensing electrodes IE1-1 to IE1-5 and the second sensing electrodes IE2-1 to IE2-4 have a shape (e.g., a bar shape) in which the sensor part and the connection part are not distinguished from each other. Although the first sensor parts SP1 and the second sensor parts SP2, each of which has a diamond shape, are exemplarily illustrated, the embodiment of the present invention is not necessarily limited thereto, and the first sensor parts SP1 and the second sensor parts SP2 may have different polygonal shapes.

The first sensor parts SP1 are arranged in the second direction DR2 within one first sensing electrode, and the second sensor parts SP2 are arranged in the first direction DR1 within one second sensing electrode. Each of the first connection pans CP1 connects the first sensor parts SP1 adjacent to each other, and each of the second connection parts CP2 connects the second sensor parts SP2 adjacent to each other.

Each of the first sensing electrodes IE1-1 to IE1-5 and the second sensing electrodes IE2-1 to IE2-4 may have a mesh shape. Since each of the first sensing electrodes IE1-1 to IE1-5 and the second sensing electrodes IE2-1 to IE2-4 has the mesh shape, parasitic capacitance with the electrodes of the display panel DP (see FIG. 3) may be reduced. In addition, as will be described later, since the first sensing electrodes IE1-1 to IE1-5 and the second sensing electrodes IE2-1 to IE2-4 might not overlap emission areas PXA-R, PXA-G, and PXA-B (see FIG. 5A), the display device DD might not be visible to the user.

Each of the first sensing electrodes IE1-1 to IE1-5 and the second sensing electrodes IE2-1 to IE2-4 having the mesh shape may include silver, aluminum, copper, chromium, nickel, and titanium, which may be processed at a low temperature, but is not necessarily limited thereto. Even when the input sensing unit ISP is formed through the continuous process, the organic light emitting diodes OLED (see FIG. 6) may be prevented from being damaged.

The first signal lines SL1-1 to SL1-5 are connected to ends of the first sensing electrodes IE1-1 to IE1-5, respectively. In an embodiment of the present invention, the input sensing unit ISP may further include signal lines connected to the other ends of the first sensing electrodes IE1-1 to IE1-5.

The first signal lines SL1-1 to SL1-5 and the second signal lines SL2-1 to SL2-4 may be disposed in the peripheral area NAA. The input sensing panel ISP ma include the input pads I-PD extending from ends of the first signal lines SL1-1 through SL1-5 and the second signal lines SL2-1 through SL2-4 and disposed in the peripheral area NAA.

Figure 5A:
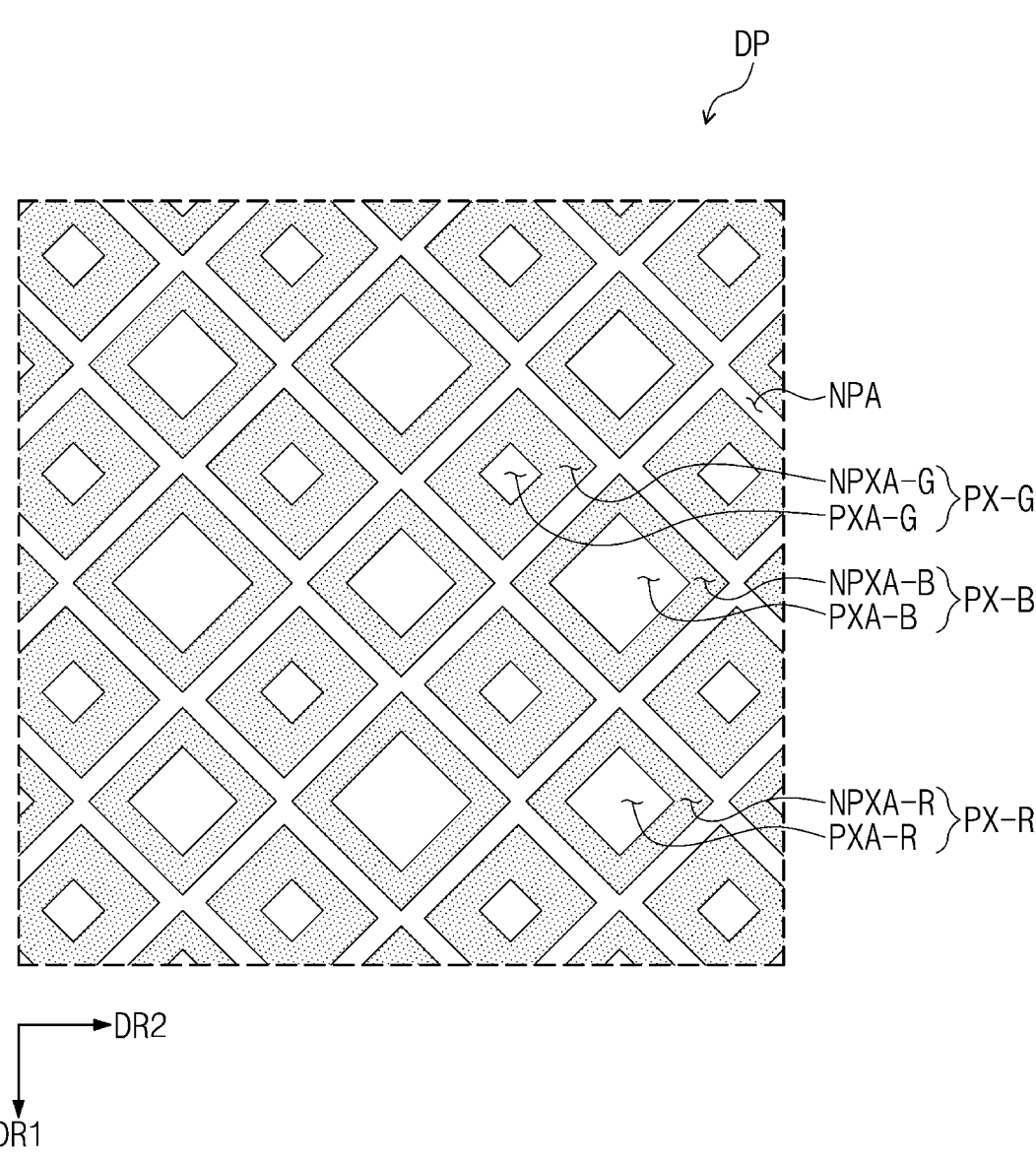
FIG. 5A is an enlarged plan view of the display panel corresponding to an area FF illustrated in FIG. 3.
Figure 5B:
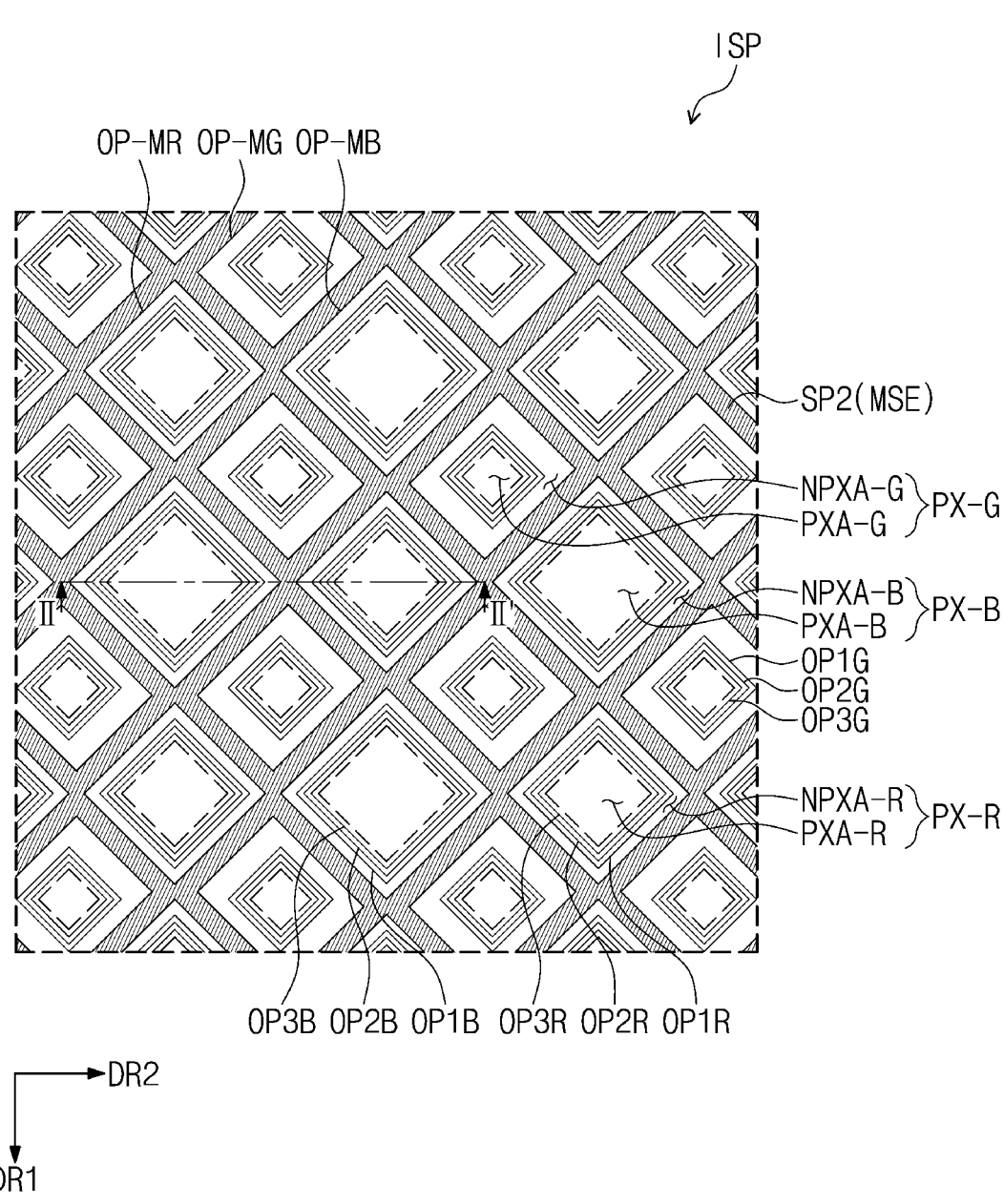
FIG. 5B is an enlarged plan view illustrating the area FF of the input sensing unit illustrated in FIG. 4.

FIG. 5A an enlarged plan view of the display panel corresponding to an area FF illustrated in FIG. 3, and FIG. 5B is an enlarged plan view illustrating the area FF of the input sensing unit illustrated in FIG. 4.

Referring to FIGS. 3 and 5A, the display panel DP includes a plurality of pixels PX. As an example of the present invention, each of the plurality of pixels PX may be one of a plurality of first pixels PX-G, a plurality of second pixels PX-R, and a plurality of third pixels PX-B. As an example of the present invention, the plurality of first pixels PX-G, the plurality of second pixels PX-R, and the plurality of third pixels PX-B may have different sizes. For example, each of the first pixels PX-G may have a size that is less than that of each of the second and third pixels PX-R and PX-B, and each of the second pixels PX-R may have a size that is less than that of each of the third pixels PX-B. As an example of the present invention, the first pixels PX-G may be green pixels, the second pixels PX-R may be red pixels, and the third pixels PX-B may be blue pixels.

The first pixels PX-G may be arranged in the first and second directions DR1 and DR2. The second and third pixels PX-R and PX-B may be alternately repeated and arranged in the first and second directions DR1 and DR2. A non-pixel area NPA may be defined between the first to third pixels PX-G, PX-R, and PX-B.

The arrangement structure of the first to third pixels PX-G, PX-R, and PX-B illustrated in FIG. 5A is only illustrated as an example, and the present invention is not necessarily limited thereto. For example, according to an embodiment of the present invention, the first pixel PX-G, the second pixel PX-R, and the third pixel PX-B may be alternately arranged in the second direction DR2. In addition, although each of the first to third pixels PX-G, PX-R, and PX-B is exemplarily illustrated to have a rectangular shape, the present invention is not necessarily limited thereto, and each of the first to third pixels PX-G, PX-R, PIX-B may be variously transformed into polygonal, circular, and oval shapes, and the like. As an example, the shapes of the first to third pixels PX-G, PX-R, and PX-B may be different from each other. For example, the first pixel PX-G may have the circular shape, and each of the second and third pixels PX-R and PX-B may have the rectangular shape.

In addition, although an example in which each of the first pixels PX-G has a size that is less than that of each of the second pixels PX-R and the third pixels PX-B is illustrated in FIG. 5A, the present invention is necessarily limited thereto. For example, in an embodiment of the present invention, the first to third pixels PX-G, PX-R, and PX-B may have the same size.

Each of the first pixels PX-G includes a first emission area PXA-G, from which first light is emitted, and a first non-emission area NPXA-G formed around the first emission area PXA-G. The second pixel PX-R includes a second emission area PXA-R, from which second light is emitted, and a second non-emission area NPXA-R formed around the second emission area PXA-R. The third pixel PX-B includes a third emission area PXA-B, from which third light is emitted, and a third non emission area NPXA-B formed around the third emission area PXA-B. Here, the first light may be light having a green wavelength band, the second light may be light having a red wavelength band, and the third light may be light having a blue wavelength band. The first to third non-emission areas NPXA-G, NPXA-R, and NPXA-B are defined as areas from which light is not emitted.

Referring to FIGS. 5A and 5B, each of the second sensor parts SP2 of the input sensing unit ISP have a mesh shape. Each of the second sensor parts SP2 includes a mesh electrode MSE patterned in a mesh shape. The second sensor parts SP2 may correspond to the non-pixel area NPA to increase in aperture ratio and decrease in parasitic capacitance of each of the first to third pixels PX-G, PX-R, and PX-B. The mesh electrode MSE may partially overlap the first to third non-emission areas NPXA-G, NPXA-R, and NPXA-B.

Each of the first sensor parts SP1 and the second sensor parts SP2 may have a mesh shape. A plurality of sensor openings OP-MG, OP-MR, and OP-MB corresponding to the pixels PX-G, PX-R, and PX-B may be defined in each of the first sensor parts SP1 and the second sensor parts SP2. Thus, the first sensor parts SP1 and the second sensor parts SP2 might not overlap the first pixel PX-G, the second pixel PX-R, and the third pixel PX-B in a plan view. For example, the first sensor openings OP-MG may be defined in areas corresponding to the first pixel PX-G, and the second sensor openings OP-MR may be defined in areas corresponding to the second pixel PX-R, and the third sensor openings OP-MB may be defined M areas corresponding to the third pixel PX-B.

Figure 6:
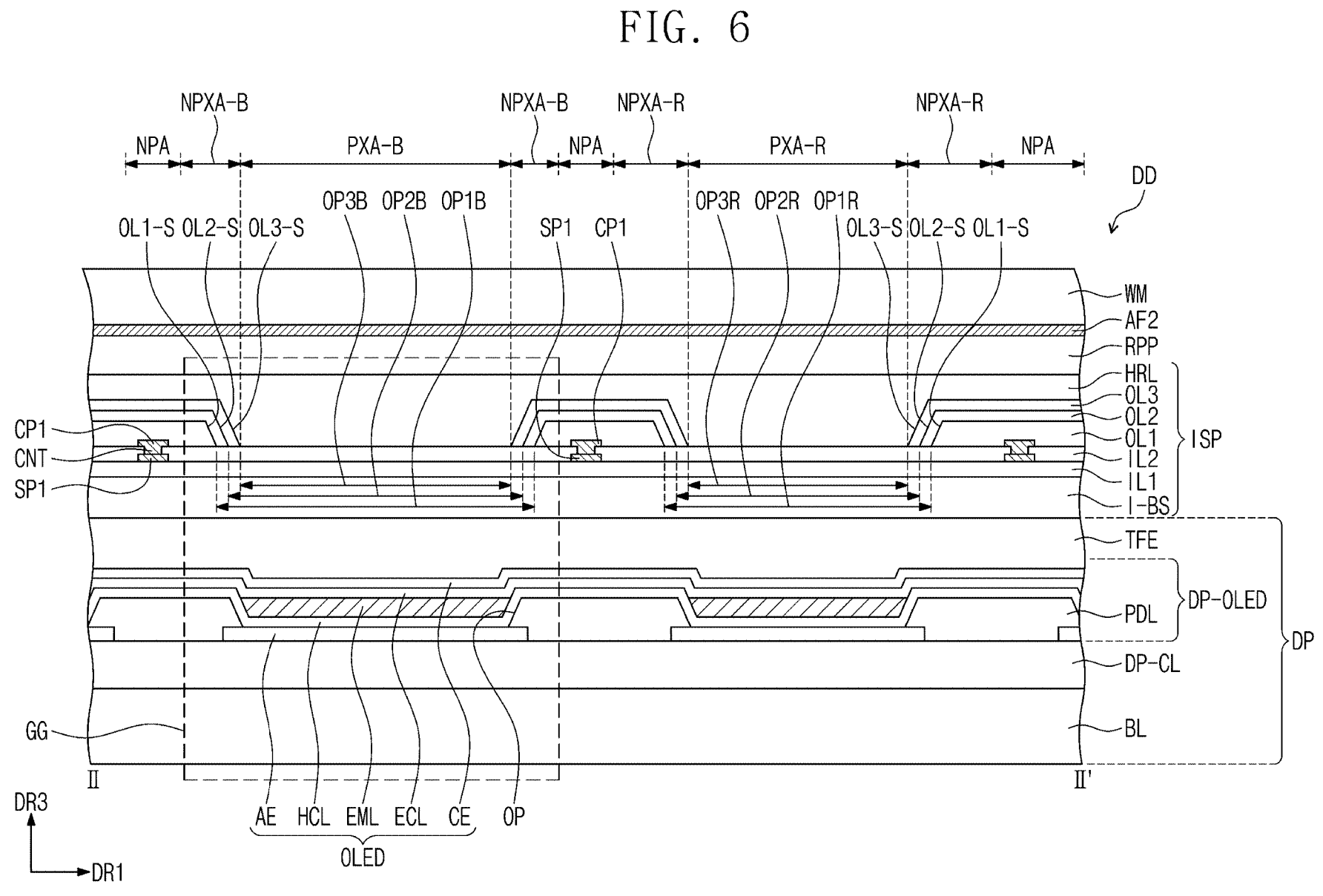
Figure 7:
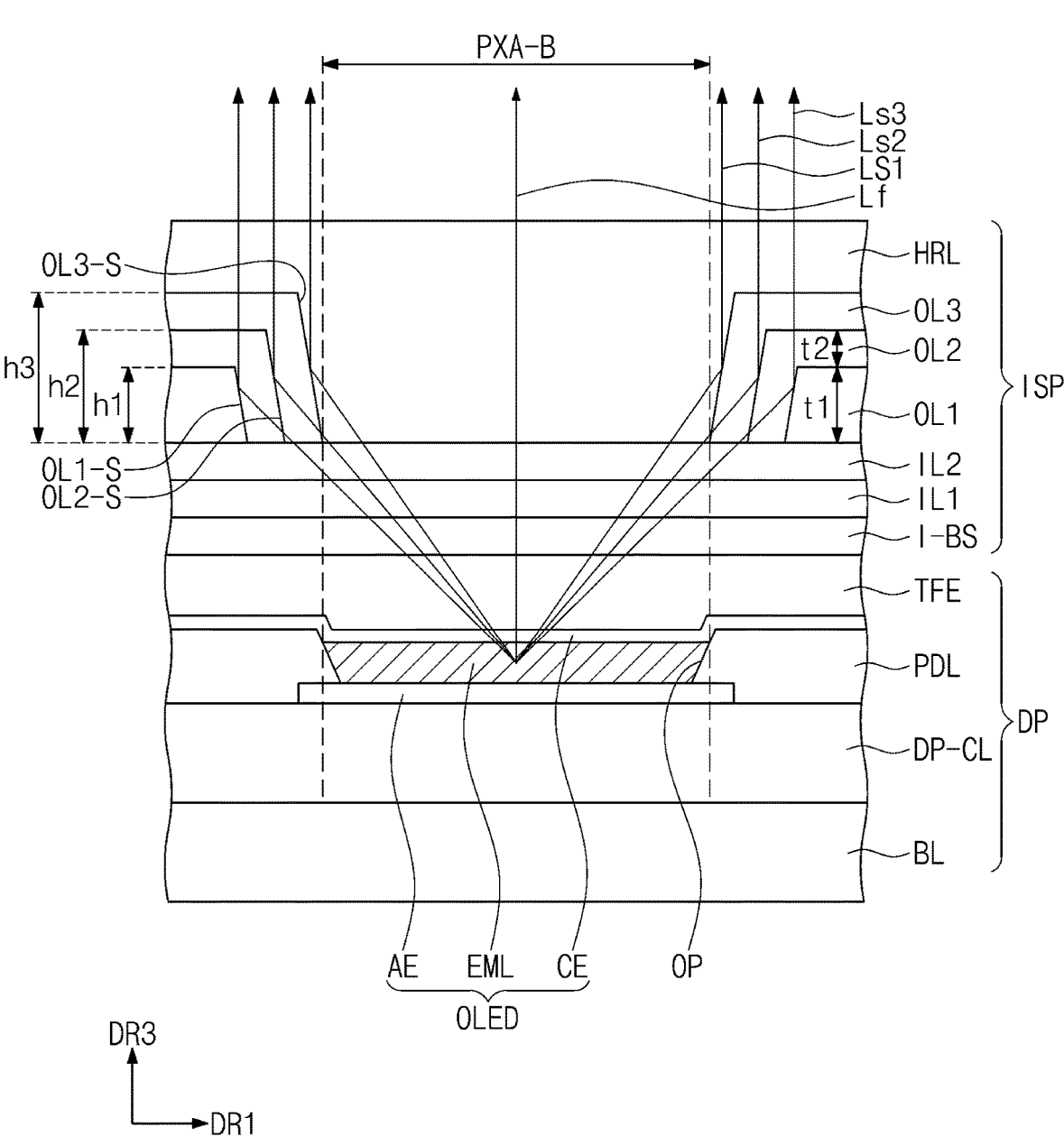
FIG. 7 is an enlarged cross-sectional view of a portion GG illustrated in FIG. 6.

FIG. 6 is a cross-sectional view of the display device, taken along line II-II' of FIG. 5B according to an embodiment of the present invention, and FIG. 7 is an enlarged cross-sectional view of a portion. GG illustrated in FIG. 6. However, a hole control layer HCL and an electron control layer ECL of the light emitting device OLED illustrated in FIG. 6 are removed in FIG. 7 for convenience of description.

In the display device DD, according to an embodiment of the present invention, the display panel DP may include a base layer BL, a circuit element layer DP-CL disposed on the base layer BL, a display element layer DP-OLED, and a thin film encapsulation layer TFE. The display panel DP may further include functional layers such as the anti-reflection layer, a reflective index adjusting layer, and the like.

The base layer BL may include a synthetic resin film. A synthetic resin layer is disposed on a working substrate used for manufacturing the display panel DP. Thereafter, a conductive layer, an insulating layer, and the like may be disposed on the synthetic resin layer. When the working substrate is removed, the synthetic resin layer corresponds to the base layer BL. The synthetic resin layer may be a polyimide resin layer, and the material thereof is not limited to what is described herein. In addition, the base layer BL may include a glass substrate, a metal substrate, and an organic/inorganic composite substrate.

The circuit element layer DP-CL includes at least one insulating layer and a circuit element. Hereinafter, the insulating layer provided in the circuit element layer DP-CL may be called an intermediate insulating layer. The intermediate insulating layer includes at least one intermediate inorganic film and at least one intermediate organic film. The circuit element includes the signal line and the driving circuit of the pixel. The circuit element layer DP-CL may be formed through a process of forming an insulating layer, a semiconductor layer, and a conductive layer by coaling or deposition and a process of patterning the insulating layer, the semiconductor layer, and the conductive layer by a photolithography process.

The display element layer DP-OLED may include a pixel defining layer PDL and an organic light emitting diode OLED. The pixel defining layer PDL may include an organic material. A first electrode AE is disposed on the circuit element layer DP-CL. The pixel defining layer PDL is disposed on the first electrode AE. An opening OP is defined m the pixel defining layer PDL. The pixel opening OP of the pixel defining layer PDL exposes at least a portion of the first electrode AE. In an embodiment of the present invention, the pixel defining layer PDL may be omitted.

Referring to FIGS. 5A and 6, the display panel DP may include emission areas PXA-G, PXA-R, and PXA-B and non-emission areas NPXA-G, NPXA-R, and NPXA-B adjacent to the emission areas PXA-G, PXA-R, and PXA-B. Each of the non-emission areas NPXA-G, NPXA-R, and NPXA-B may surround the corresponding emission areas PXA-G, PXA-R, and PXA-B, respectively. In this embodiment, the emission areas PXA-G, PXA-R, and PXA-B are defined to correspond to a partial area of the first electrode AE exposed by the pixel opening OP. A non-pixel area NPA may be defined between the non-emission areas NPXA-G, NPXA-R, and NPXA-B.

The hole control layer HCL may be commonly disposed on to the emission areas PXA-G, PXA-R, and PXA-B, the non-emission areas NPXA-G, NPXA-R, and NPXA-B, and the non-pixel area NPA. An emission layer EML emitting light is disposed on the hole control layer HCL. The emission layer EML may be disposed in an area corresponding to the pixel opening OP. For example, the emission layer EML may be formed separately in each of the pixels PX-G, PX-R, and PX-B. Also, the emission layer EML may include an organic material and/or an inorganic material. The emission layer EML may generate light having a predetermined color. For example, the emission layer EML may generate at least one of red light, green light, and blue light.

Although the patterned emission layer EML is illustrated as an example in this embodiment, the emission layer EML may be disposed on the emission areas PXA-G, PXA-R, and PXA-B. Here, the emission layer EML may emit white light. Also, the emission layer EML may have a multilayer structure that is called a tandem.

An electronic control layer ECL is disposed on the light emitting layer EML. The electronic control layer ECL may be commonly formed in the emission areas PXA-G, PXA-R, and PXA-B, the non-emission areas NPXA-G, NPXA-R, and NPXA-B, and the non-pixel area NPA. A second electrode CE is disposed on the electron control layer ECL. The second electrode CE is commonly disposed in the emission areas PXA-G, PXA-R, and PXA-B, the non-emission areas NPXA-G, NPXA-R, and NPXA-B, and the non-pixel area NPA.

The thin film encapsulation layer TFE is disposed on the second electrode CE. The thin film encapsulation layer TFE seals the display element layer DP-OLED. The thin film encapsulation layer TFE includes at least one insulating layer. The thin film encapsulation layer TFE, according to an embodiment of the present invention, may include at least one inorganic layer (hereinafter, referred to as an encapsulation inorganic film). The thin film encapsulation layer TFE, according to an embodiment of the present invention, may include at least on organic layer (hereinafter, referred to as an encapsulation organic film) and at leas one encapsulation inorganic layer.

The encapsulation inorganic film protects the display element layer DP-OLED against moisture/oxygen, and the encapsulation organic film protects the display element layer DP-OLED against foreign substances such as dust particles. The encapsulation inorganic layer may include a silicon nitride layer, a silicon oxy nitride layer, a silicon oxide layer, a titanium oxide layer, or an aluminum oxide layer, but is not necessarily limited thereto. The encapsulation organic layer may include an acrylic-based organic layer, but is not necessarily limited thereto.

The input sensing unit ISP may be disposed directly on the display panel DP. The input sensing unit ISP may be disposed directly on the thin film encapsulation layer TFE of the display panel DP. The input sensing unit ISP includes a base layer I-BS, first and second conductive layers disposed on the base layer I-BS, and first and second inorganic insulating layers IL1 and IL2. The base layer I-BS is disposed on the thin film encapsulation layer TFE and may include an inorganic material. For example, the base layer I-BS may include a silicon nitride layer. The inorganic layer disposed at the uppermost side of the thin film encapsulation layer TFE may also include silicon nitride. The base layer I-BS and the silicon nitride layer of the thin film encapsulation layer TFE may be disposed under different deposition conditions.

The first inorganic insulating layer IL1 may be disposed on the base layer I-BS. The first inorganic insulating layer IL1 may include the same material as the base layer I-BS. The first inorganic insulating layer IL1 may have a thickness that is less than that of the base layer I-BS. The first inorganic insulating layer IL1 may be omitted. Although a structure in which the input sensing unit ISP includes the base layer I-BS is illustrated in FIG. 6, the present invention is not necessarily limited thereto. For example, the input sensing unit ISP might not include the base layer I-BS. In this case, the first inorganic insulating layer IL1 may be disposed directly on the thin film encapsulation layer TFE.

Referring to FIGS. 4, 5B, and 6, the first conductive layer is disposed on the first inorganic insulating layer IL1. The first conductive layer may include a first sensing part SP1, a second sensing part SP2, and a second connection part CP2. The second conductive layer is disposed on the first conductive layer. The second conductive layer may include a first connection part CP1. The second inorganic insulating layer IL2 is disposed between the first conductive layer and the second conductive layer. The second inorganic insulating layer IL2 spaces and separates the first conductive layer from the second conductive layer on the cross-section. A contact hole CNT for partially exposing the first sensing part SP1 may be provided in the second inorganic insulating layer IL2, and the first connection unit CP1 may be connected to the first sensing part SP1 through the contact hole CNT. The second inorganic insulating layer IL2 is disposed on the first inorganic insulating layer IL1.

The second inorganic insulating layer IL2 may include the same material as the first inorganic insulating layer IL1 and the base layer I-BS. Each of the first and second inorganic insulating layers IL1 and IL2 may have a thickness that is less than that of the base layer I-BS.

A first organic insulating layer OL1 may be disposed on the second conductive layer. The first organic insulating layer OL1 may have a first refractive index. The first organic insulating layer OL1 may include an organic insulating material. The organic insulating material may include an acrylic-based resin, a methacrylic-based resin, a polyiso-prene-based resin, a vinyl-based resin, an epoxy-based resin, a urethane-based resin, a cellulose-based resin, as siloxane-based resin, a polyimide-based resin, a polyamide-based resin, and/or a perylene-based resin. However, this is merely an example, and the organic insulating material is not necessarily limited to the above example.

A plurality of first openings OP1G, OP1R, and OP1B may be defined in the first organic insulating layer OL1. The first openings OP1G, OP1R, and OP1B may correspond to the emission areas PXA-G, PXA-R, and PXA-B of the pixels PX-G, PX-R, and PX-B, respectively. The first openings OP1G, OP1R, and OP1B may overlap the emission areas PXA-G, PXA-R, and PXA-B of the pixels PX-G, PX-R, and PX-B in a plan view, respectively. The first openings OP1G, OP1R, and OP1B may have different sizes.

The first openings OP1G, OP1R, and OP1B may include a first sub-opening OP1G corresponding to the first emission area PXA-G of the first pixel PX-G, a second sub-opening OP1R corresponding to the second emission area PXA-R of the second pixel PX-R, and a third sub-opening OP1B corresponding to the third emission area PXA-B of the third pixel PX-B. The first sub-opening OP1G may have a shape and a size corresponding to the first emission area PXA-G, and the second sub-opening OP1R may have a shape and a size corresponding to the second emission area PXA-R, and the third sub-opening OP1B may have a shape and a size corresponding to the third emission area PXA-B. Thus, as an example of the present invention, the first to third sub-openings OP1G, OP1R, and OP1B may have different sizes.

A plurality of first inclined surfaces OL1-S defining the first openings OP1G, OP1R, and OP1B may be provided in the first organic insulating layer OL1. The plurality of first inclined surfaces OL1-S may have a shape that is inclined with respect to a top surface of the second inorganic insulating layer IL2 and may have a first height h1 measured from the second inorganic insulating layer IL2.

A second organic insulating layer OL2 may be disposed on the first organic insulating layer OL1. The second organic insulating layer OL2 may include an organic insulating material. The organic insulating material may include an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and/or a perylene-based resin. However, this is merely an example, and the organic insulating material is not necessarily limited to the above example. The second organic insulating layer OL2 may be made of an organic insulating material having a refractive index that is greater than that of the first organic insulating layer OL1.

A plurality of second openings OP2G, OP2R, and OP2B may be defined in areas corresponding to the plurality of first openings OP1G, OP1R, and OP1B in the second organic insulating layer OL2, respectively. The second openings OP2G, OP2R, and OP2B may overlap the emission areas PXA-G, PXA-R, and PXA-B of each pixel PX-G, PX-R, and PX-B in a plan view, respectively. As an example of the present invention, each of the second openings OP2G, OP2R, and OP2B may have a size that is less than that of each of the corresponding first openings OP1G, OP1R, and OP1B.

The second openings OP2G, OP2R, and OP2B may include a fourth sub-opening OP2G corresponding to the first emission area PXA-G of the first pixel PX-G, a fifth sub-opening OP2R corresponding to the second emission area PXA-R of the second pixel PX-R, and a sixth sub-opening OP2B corresponding to the third emission area PXA-B of the third pixel PX-B. The fourth sub-opening OP2G may have a shape and a size corresponding to the first emission area PXA-G, and the fifth sub-opening OP2R may have a shape and a size corresponding to the second emission area PXA-R, and the sixth sub-opening OP2B may have a shape and a size corresponding to the third emission area PXA-B. Thus, as an example of the present invention, the fourth to sixth sub-openings OP2G, OP2R, and OP2B may have different sizes.

In addition, the fourth sub-opening OP2G corresponds to the first sub-opening OP1G, the fifth sub-opening OP2R corresponds to the second sub-opening OP1R, and the sixth sub-opening OP2B correspond to the third sub-opening OP1B. Here, the fourth sub-opening OP2G has a size that is less than that of the first sub-opening OP1G, the fifth sub-opening OP2R has a size that is less than that of the second sub-opening OP1R, and the sixth sub-opening OP2B has a size that is less than that of the third sub-opening OP1B.

A plurality of second inclined surfaces OL2-S defining the second openings OP2G, OP2R, and OP2B may be provided in the second organic insulating layer OL2. The plurality of second inclined surfaces OL2-S may have a shape that is inclined with respect to the top surface of the second inorganic insulating layer IL2 and may have a second height h2 measured from the second inorganic insulating layer IL2. For example, each of the second inclined surfaces OL2-S may have a height that is greater than that of the first inclined surfaces OL1-S.

The second organic insulating layer OL2 covers a top surface of the first organic insulating layer OL1 and the plurality of first inclined surfaces OL1-S. Here, the plurality of second inclined surfaces OL2-S may be provided in parallel to the first inclined surfaces OL1-S. Also, the plurality of second inclined surfaces OL2-S may be spaced apart from the plurality of first inclined surfaces OL1-S, in a plan view. For example, each of the plurality of second inclined surfaces OL2-S may be disposed closer to the corresponding emission area PXA-B than the corresponding first inclined surface OL1-S.

A third organic insulating layer OL3 may be disposed on the second organic insulating layer OL2. The third organic insulating layer OL3 may include an organic insulating material. The organic insulating material may include an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and/or a perylene-based resin. However, this is merely an example, and the organic insulating material is not necessarily limited to the above example. The third organic insulating layer OL3 may be made of an organic insulating material having a refractive index that is greater than that of the second organic insulating layer OL2.

In the third organic insulating layer OL3, a plurality of third openings OP3G, OP3R, and OP3B may be defined in areas corresponding to the plurality of second openings OP2G, OP2R, and OP2B, respectively. The third openings OP3G, OP3R, and OP3B may overlap the emission areas PXA-G, PXA-R, and PXA-B of the pixels PX-G, PX-R, and PX-B in a plan view, respectively. As an example of the present invention, each of the third openings OP3G, OP3R, and OP3B may have a size that is less than that of each of the corresponding second openings OP2G, OP2R, and OP2B.

The third openings OP3G, OP3R, and OP3B may include a seventh sub-opening OP3G corresponding to the first emission area PXA-G of the first pixel PX-G, an eighth sub-opening OP3R corresponding to the second emission area PXA-R of the second pixel PX-R, and a ninth sub-opening OP3B corresponding to the third emission area PXA-B of the third pixel PX-B. The seventh sub-opening OP3G may have a shape and a size corresponding to the first emission area PXA-G, and the eighth sub-opening OP3R may have a shape and a size corresponding to the second emission area PXA-R, and the ninth sub-opening OP3B may have a shape and a size corresponding to the third emission area PXA-B. Thus, as an example of the present invention, the seventh to ninth sub-openings OP3G, OP3R, and OP3B may have different sizes.

Also, the seventh sub-opening OP3G corresponds to the fourth sub-opening OP2G, the eighth sub-opening OP3R corresponds to the fifth sub-opening OP2R, and the ninth sub-opening OP3B corresponds to the sixth sub-opening OP2B. Here, the seventh sub-opening OP3G has a size that is less than that of the fourth sub-opening OP2G, the eighth sub-opening OP3R has a size that is less than that of the fifth sub-opening OP2R, and the ninth sub-opening OP3B has a size that is less than that of the sixth sub-opening OP2B.

A plurality of third inclined surfaces OL3-S defining the third openings OP3G, OP3R, and OP3B may be provided in the third organic insulating layer OL3. The plurality of third inclined surfaces OL3-S may have a shape that is inclined with respect to the top surface of the second inorganic insulating layer IL2 and may have a third height h3 measured from the second inorganic insulating layer IL2. For example, each of the third inclined surfaces OL3-S may have a height that is greater than that of the second inclined surfaces OL2-S.

The third organic insulating layer OL3 covers the top surface of the second organic insulating layer OL2 and the plurality of second inclined surfaces OL2-S. The plurality of third inclined surfaces OL3-S may be provided in parallel to the second inclined surfaces OL2-S. Also, the plurality of third inclined surfaces OL3-S may be spaced apart from the plurality of second inclined surfaces OL2-S in a plan view. For example, each of the plurality of third inclined surfaces OL3-S may be disposed closer to the corresponding emission area PXA-B than the corresponding second inclined surface OL2-S.

A high refractive insulating layer HRL may be disposed on the third organic insulating layer OL3. The high refractive insulating layer HRL may have a refractive index that is greater than that of the third organic insulating layer OL3. As an example of the present invention, the high refractive insulating layer HRL may have a refractive index of 1.65 or more and 1.70 or less. The high refractive insulating layer HRL may include an organic insulating material having a refractive index that is greater than that of the organic insulating material forming the third organic insulating layer OL3. The high refractive insulating layer HRL may include, for example, zirconia.

The high refractive insulating layer HRL may fill the third openings OP3G, OP3R, and OP3B. The high refractive insulating layer HRL, may have a flat top surface.

Light emitted from the light emitting device OLED may be emitted in the frontward direction, for example, in the third direction DR3, as well as in the lateral direction. Emission efficiency may be determined based on the light emitted in the frontward direction. According to an embodiment of the present invention, front light Lf emitted from the light emitting device OLED in the frontward direction may pass through the high refractive insulating layer HRL and then be emitted. Side light Ls1, Ls2, and Ls3 emitted from the light emitting element OLED in the lateral direction may include first side light Ls1, second side light Ls2, and third side light Ls2, which are divided according to an emission angle. Here, the emission angle may be defined as an angle inclined with respect to the front light Lf. The second side light Ls2 may have an emission angle greater than that of the first side light Ls1, and the third side light Ls3 may have an emission angle greater than that of the second side light Ls2.

The first side light Ls1 may be refracted or totally reflected due to a difference in refractive index between the third organic insulating layer OL3 and the high refractive insulating layer HRL. Thus, a light path of the first side light Ls1 may be changed in the frontward direction, for example, in the third direction DR3 or a direction close to the third direction DR3. The second side light Ls2 may be refracted or totally reflected due to a difference in refractive index between the second organic insulating layer OL2 and the third organic insulating layer OL3. Thus, a light path of the second side light Ls2 may be changed in the frontward direction, for example, in the third direction DR3 or a direction close to the third direction DR3. The third side light Ls3 may be refracted or totally reflected due to a difference in refractive index between the first organic insulating layer OL1 and the second organic insulating layer OL2. Thus, a light path of the third side light Ls3 may be changed in the frontward direction, for example, in the third direction DR3 or a direction close to the third direction DR3. As such, as the light paths of the first to third side lights Ls1, Ls2, and Ls3 are changed in the frontward direction, the emission efficiency of the display device DD ma be increased.

A first thickness t1 of the first organic insulating layer OL1 may be thicker than the second thickness t2 of each of the second and third organic insulating layers OL2 and OL3. As the first thickness t1 of the first organic insulating layer OL1 is thicker than the second thickness t2, the first height h1 of the first inclined surfaces OL1-S may increase. However, the embodiment of the present invention is not necessarily limited thereto. For example, the first to third organic insulating layers OL1 to OL3 may have the same thickness.

Figure 8:
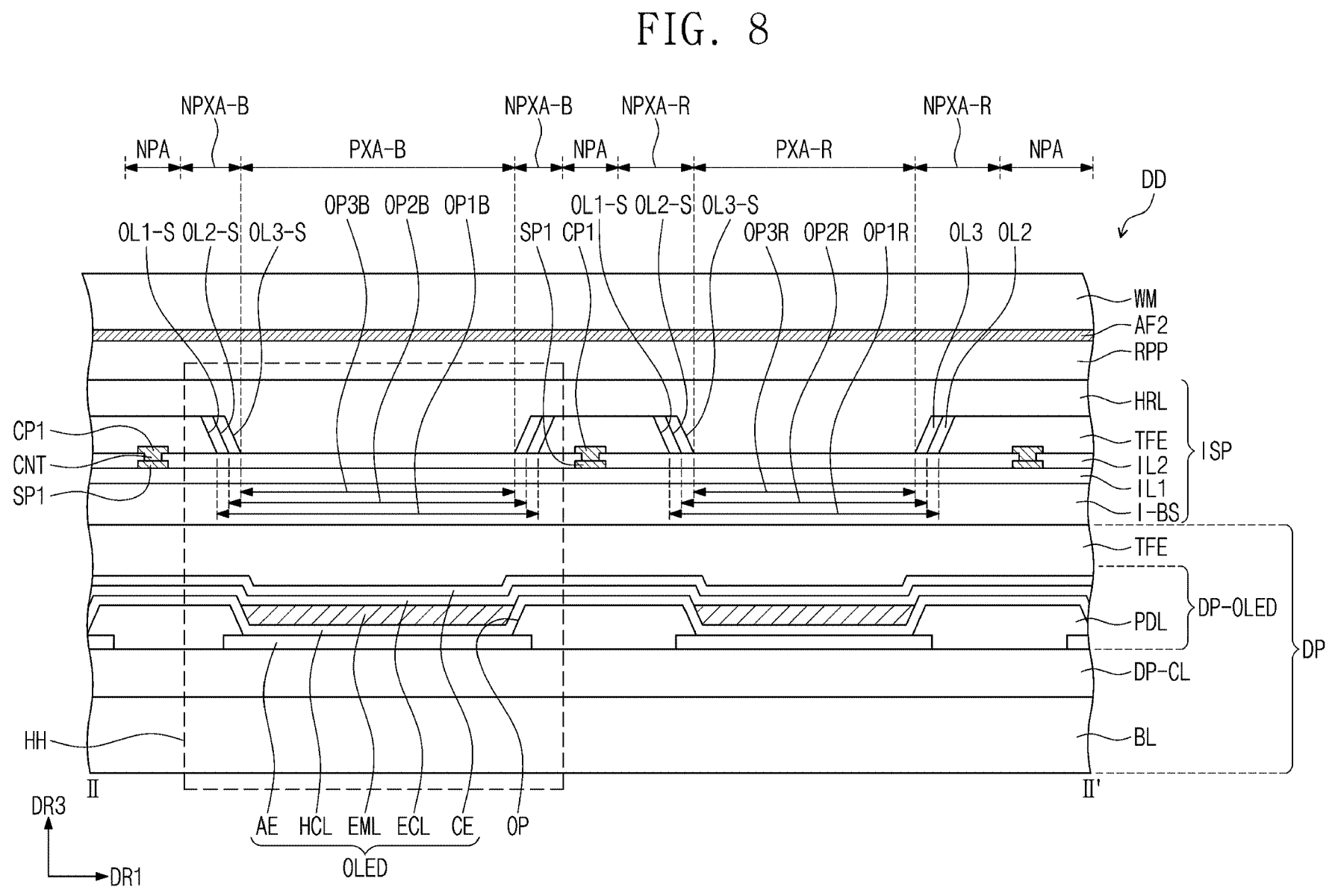
Figure 9:
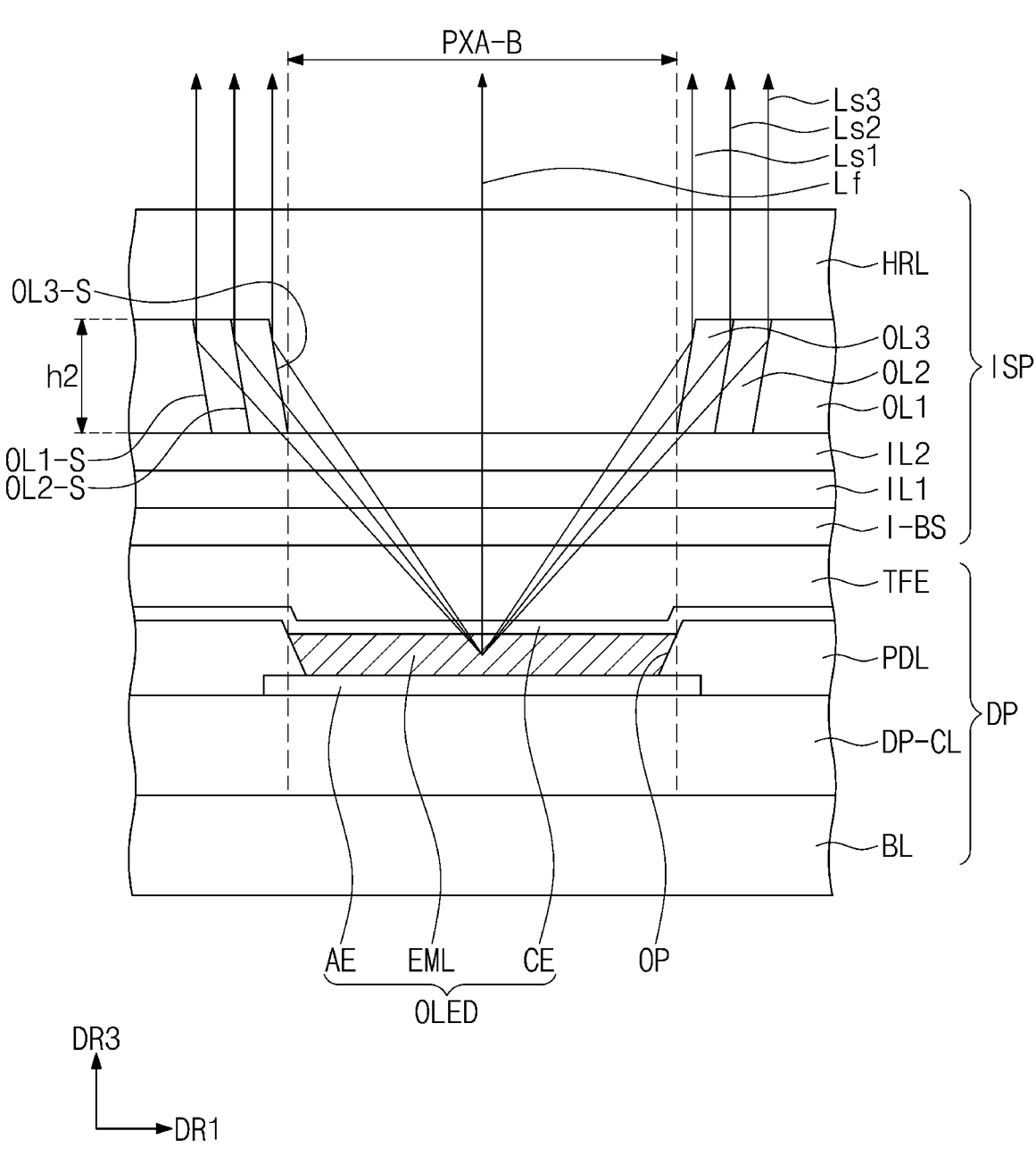
FIG. 9 is an enlarged cross-sectional view of a portion HH illustrated in FIG. 8.

FIG. 8 is a cross-sectional view of a display device, taken along line II-II' of FIG. 5B according to an embodiment of the present invention, and FIG. 9 is an enlarged cross-sectional view of a portion HH illustrated in FIG. 8.

Referring to FIGS. 5B, 8, and 9, in a display device DD, according to an embodiment of the present invention, a first organic insulating layer OL1 may be disposed on a second conductive layer. The first organic insulating layer OL1 may have a first refractive index. The first organic insulating layer OL1 may include an organic insulating material. The organic insulating material may include an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and/or a perylene-based resin. However, this is merely an example, and the organic insulating material is not necessarily limited to the above example.

A plurality of first openings OP1G, OP1R, and OP1B may be defined in the first organic insulating layer OL1. The first openings OP1G, OP1R, and OP1B may correspond to the emission areas PXA-G, PXA-R, and PXA-B of the pixels PX-G, PX-R, and PX-B, respectively. The first openings OP1G, OP1R, and OP1B may overlap the emission areas PXA-G, PXA-R, and PXA-B of the pixels PX-G, PX-R, and PX-B in a plan view, respectively. The first openings OP1G, OP1R, and OP1B may have different sizes.

The first openings OP1G, OP1R, and OP1B may include a first sub-opening OP1G corresponding to the first emission area PXA-G of the first pixel PX-G, a second sub-opening OP1R corresponding to the second emission area PXA-R of the second pixel PX-R, and a third sub-opening OP1B corresponding to the third emission area PXA-B of the third pixel PX-B. The first sub-opening OP1G may have a shape and a size corresponding to the first emission area PXA-G, and the second sub-opening OP1R may have a shape and a size corresponding to the second emission area PXA-R, and the third sub-opening OP1B may have a shape and a size corresponding to the third emission area PXA-B. Thus, as an example of the present invention, the first to third sub-openings OP1G, OP1R, and OP1B may have different sizes.

A plurality of first inclined surfaces OL1-S defining the first openings OP1G, OP1R, and OP1B may be provided in the first organic insulating layer OL1. The plurality of first inclined surfaces OL1-S may have a shape that is inclined with respect to a top surface of the second inorganic insulating layer IL2 and may have a second height h2 measured from the second inorganic insulating layer IL2.

A second organic insulating layer OL2 may be disposed on the first inclined surfaces OL1-S of the first organic insulating layer OL1. For example, the second organic insulating layer OL2 may cover the first inclined surfaces OL1-S without covering a top surface of the first organic insulating layer OL1. The second organic insulating layer OL2 may cover the first inclined surfaces OL1-S and a portion of the top surface of the first organic insulating layer OL1 adjacent to the first inclined surfaces OL1-S.

The second organic insulating layer OL2 may include an organic insulating material. Particularly, the second organic insulating layer OL2 may be made of an organic insulating material having a refractive index that is greater than that of the first organic insulating layer OL1.

A plurality of second openings OP2G, OP2R, and OP2B may be defined in areas corresponding to the plurality of first openings OP1G, OP1R, and OP1B in the second organic insulating layer OL2, respectively. The second openings OP2G, OP2R, and OP2B may overlap the emission areas PXA-G, PXA-R, and PXA-B of each pixel PX-G, PX-R, and PX-B in a plan view, respectively. As an example of the present invention, each of the second openings OP2G, OP2R, and OP2B may have a size that is less than that of each of the corresponding first openings OP1G, OP1R, and OP1B.

The second openings OP2G, OP2R, and OP2B may include a fourth sub-opening OP2G corresponding to the first emission area PXA-G of the first pixel PX-G, a fifth sub-opening OP2R corresponding to the second emission area PXA-R of the second pixel PX-R, and a sixth sub-opening OP2B corresponding to the third emission area PXA-B of the third pixel PX-B. The fourth sub-opening OP2G may have a shape and a size corresponding to the first emission area PXA-G, and the fifth sub-opening OP2R may have a shape and a size corresponding to the second emission area PXA-R, and the sixth sub-opening OP2B may have a shape and a size corresponding to the third emission area PXA-B. Thus, as an example of the present invention, the fourth to sixth sub-openings OP2G, OP2R, and OP2B may have different sizes.

In addition, the fourth sub-opening OP2G corresponds to the first sub-opening OP1G, the fifth sub-opening OP2R corresponds to the second sub-opening OP1R, and the sixth sub-opening OP2B corresponds to the third sub-opening OP1B. Here, the fourth sub-opening OP2G has a size that is less than that of the first sub-opening OP1G, the fifth sub-opening OP2R has a size that is less than that of the second sub-opening OP1R, and the sixth sub-opening OP2B has a size that is less than that of the third sub-opening OP1B.

A plurality of second inclined surfaces OL2-S defining the second openings OP2G, OP2R, and OP2B may be provided in the second organic insulating layer OL2. The plurality of second inclined surfaces OL2-S may have a shape that is inclined with respect to a top surface of the second inorganic insulating layer IL2 and may have a second height h2 measured from the second inorganic insulating layer IL2. For example, each of the second inclined surfaces OL2-S may have the same height as each of the first inclined surfaces OL1-S.

Here, the plurality of second inclined surfaces OL2-S may be provided in parallel to the first inclined surfaces OL1-S. Also, the plurality of second inclined surfaces OL2-S may be spaced apart from the plurality of first inclined surfaces OL1-S in a plan view. For example, each of the plurality of second inclined surfaces OL2-S may be disposed closer to the corresponding emission area PXA-B than the corresponding first inclined surface OL1-S.

A third organic insulating layer OL3 may be disposed on the second inclined surfaces OL2-S of the second organic insulating layer OL2. For example, the third organic insulating layer OL3 may cover the second inclined surfaces OL2-S without covering lire top surface of the second organic insulating layer OL2. The third organic insulating layer OL3 may cover a portion of the top surface of the second organic insulating layer OL2 adjacent to the first inclined surfaces OL1-S and the second inclined surfaces OL2-S.

The third organic insulating layer OL3 may include an organic insulating material. The third organic insulating layer OL3 may be made of an organic insulating material having a refractive index that is greater than that of the second organic insulating layer OL2.

In the third organic insulating layer OL3, a plurality of third openings OP3G, OP3R, and OP3B may be defined in areas corresponding to the plurality of second openings OP2G, OP2R, and OP2B, respectively. The third openings OP3G, OP3R, and OP3B may overlap the emission areas PXA-G, PXA-R, and PXA-B of the pixels PX-G, PX-R, and PX-B in a plan view, respectively. As an example of the present invention, each of the third openings OP3G, OP3R, and OP3B may have a size that is less than that of each of the corresponding second openings OP2G, OP2R, and OP2B.

The third openings OP3G, OP3R, and OP3B may include a seventh sub-opening OP3G corresponding to the first emission area PXA-G of the first pixel PX-G, an eighth sub-opening OP3R corresponding to the second emission area PXA-R of the second pixel PX-R, and a ninth sub-opening OP3B corresponding to the third emission area PXA-B of the third pixel PX-B. The seventh sub-opening OP3G may have a shape and a size corresponding to the first emission area PXA-G, and the eighth sub-opening OP3R may have a shape and a size corresponding to the second emission area PXA-R, and the ninth sub-opening OP3B may have a shape and a size corresponding to the third emission area PXA-B. Thus, as an example of the present invention, the seventh to ninth sub-openings OP3G, OP3R, and OP3B may have different sizes.

Also, the seventh sub-opening OP3G corresponds to the fourth sub-opening OP2G, the eighth sub-opening OP3R corresponds to the fifth sub-opening OP2R, and the ninth sub-opening OP3B corresponds to the sixth sub-opening OP2B. Here, the seventh sub-opening OP3G has a size that is less than that of the fourth sub-opening OP2G, the eighth sub-opening OP3R has a size that is less than that of the fifth sub-opening OP2R, and the ninth sub-opening OP3B has a size that is less than that of the sixth sub-opening OP2B.

A plurality of third inclined surfaces OL3-S defining the third openings OP3G, OP3R, and OP3B may be provided in the third organic insulating layer OL3. The plurality of third inclined surfaces OL3-S may have a shape that is inclined with respect to the top surface of the second inorganic insulating layer IL2 and may have the second height h2 measured from the second inorganic insulating layer IL2. For example, each of the third inclined surfaces OL3-S may have the same height as each of the first and second inclined surfaces OL1-S and OL2-S. In this case, the first to third organic insulating layers OL1, OL2, and OL3 may have the same thickness.

Here, the plurality of third inclined surfaces OL3-S may be provided in parallel to the second inclined surfaces OL2-S. Also, the plurality of third inclined surfaces OL3-S may be spaced apart from the plurality of second inclined surfaces OL2-S in a plan view. For example, each of the plurality of third inclined surfaces OL3-S may be disposed closer to the corresponding emission area PXA-B than the corresponding second inclined surface OL2-S.

A high refractive insulating layer HRL may be disposed on the third organic insulating layer OL3. The high refractive insulating layer HRL may have a refractive index that is greater than that of the third organic insulating layer OL3. As an example of the present invention, the high refractive insulating layer HRL may have a refractive index of 1.65 or more and 1.70 or less. The high refractive insulating layer HRL may include an organic insulating material having a refractive index that is greater than that of the organic insulating material forming the third organic insulating layer OL3. The high refractive insulating layer HRL may include, for example, zirconia.

The high refractive insulating layer HRL may fill the third openings OP3G, OP3R, and OP3B. The high refractive insulating layer HRL may have a flat top surface.

Light emitted from the light emitting device OLED may be emitted in the frontward direction, for example, in the third direction DR3, as well as in the lateral direction. Light efficiency may be determined based on the light emitted in the frontward direction. According to an embodiment of the present invention, front light Lf emitted from the light emitting device OLED in the frontward direction may pass through the high refractive insulating layer HRL and then be emitted. Side light Ls1, Ls2, and Ls3 emitted from the light emitting element OLED in the lateral direction may include first side light Ls1, second side light Ls2, and third side light Ls2, which are divided according to an emission angle. Here, the emission angle may be defined as an angle inclined with respect to the front light Lf. The second side light Ls2 may have an emission angle greater than that of the first side light Ls1, and the third side light Ls3 may have an emission angle greater than that of the second side light Ls2.

The first side light Ls1 may be refracted or totally reflected due to a difference in refractive index between the third organic insulating layer OL3 and the high refractive insulating layer HRL. Thus, a light path of the first side light Ls1 may be changed in the frontward direction, for example, in the third direction DR3 or a direction close to the third direction DR3. The second side light Ls2 may be refracted or totally reflected due to a difference in refractive index between the second organic insulating layer OL2 and the third organic insulating layer OL3. Thus, a light path of the second side light Ls2 may be changed in the frontward direction, for example, in the third direction DR3 or a direction close to the third direction DR3. The third side light Ls3 may be refracted or totally reflected doe to a difference in refractive index between the first organic insulating layer OL1 and the second organic insulating layer OL2. Thus, a light path of the third side light Ls3 may be changed in the frontward direction, for example, in the third direction DR3 or a direction close to the third direction DR3. As such, as the light paths of the first to third side lights Ls1, Ls2, and Ls3 are changed in the frontward direction, emission efficiency of the display device DD may be increased.

Figure 10:
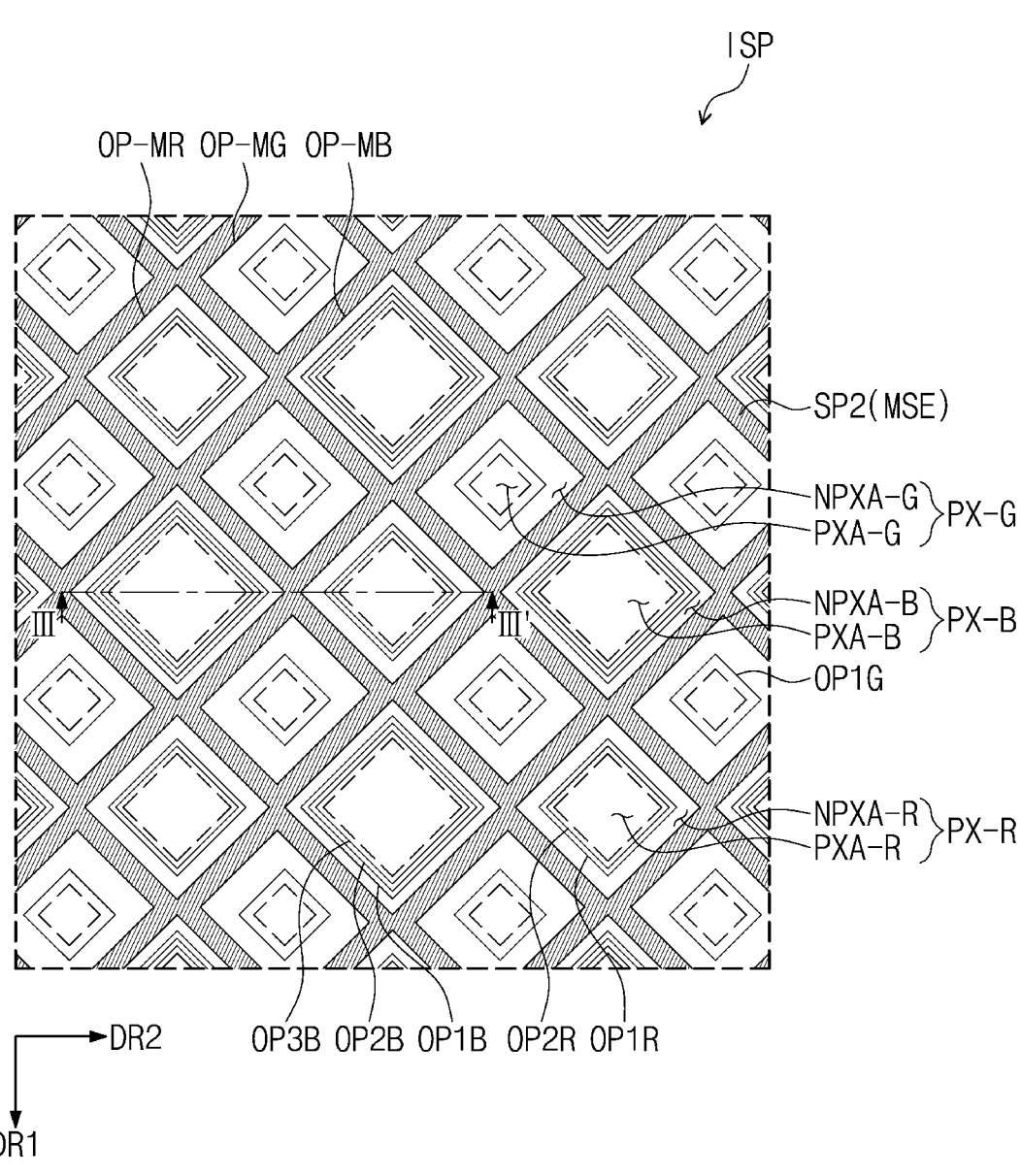
FIG. 10 is an enlarged plan view illustrating an area FF of an input sensing unit illustrated in FIG. 4 according to an embodiment of the present invention.
Figure 11:
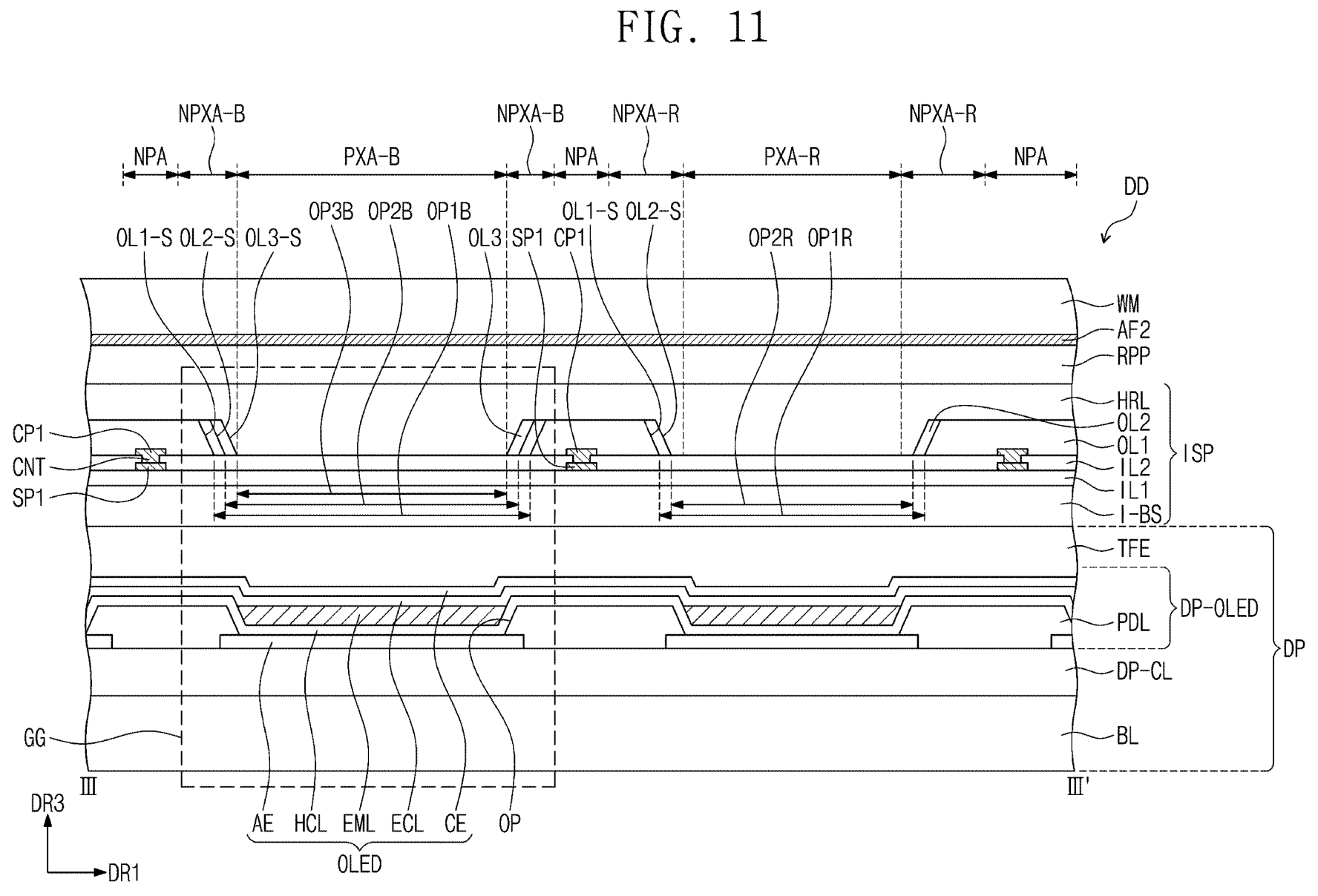

FIG. 10 is an enlarged plan view illustrating an area FF of an input sensing unit illustrated in FIG. 4 according to an embodiment of the present invention, and FIG. 11 is a cross-sectional view of a display device, taken along line III-III' of FIG. 10 according to an embodiment of the present invention.

Referring to FIGS. 4, 10, and 11, each of the first sensor parts SP1 and the second sensor parts SP2 of the input sensing unit ISP may have a mesh shape. A plurality of sensor openings OP-MG, OP-MR, and OP-MB corresponding to the pixels PX-G, PX-R, and PX-B may be defined in each of the first sensor parts SP1 and the second sensor parts SP2. Thus, the first sensor parts SP1 and the second sensor parts SP2 might not overlap the first pixel PX-G, the second pixel PX-R, and the third pixel PX-B in a plan view. For example, the first sensor openings OP-MG may be defined in areas corresponding to the first pixel PX-G, and the second sensor openings OP-MR may be defined in areas corresponding to the second pixel PX-R, and the third sensor openings OP-MB may be defined in areas corresponding to the third pixel PX-B.

A plurality of first openings OP1G, OP1R, and OP1B may be defined in the first organic insulating layer OL1. The first openings OP1G, OP1R, and OP1B may to the emission areas PXA-G, PXA-R, and PXA-B of the pixels PX-G, PX-R, and PX-B, respectively. The first openings OP1G, OP1R, and OP1B may overlap the emission areas PXA-G, PXA-R, and PXA-B of the pixels PX-G, PX-R, and PX-B in a plan view, respectively. The first openings OP1G, OP1R, and OP1B may have different sizes.

The first openings OP1G, OP1R, and OP1B may include a first sub-opening OP1G corresponding to the first emission area PXA-G of the first pixel PX-G, a second sub-opening OP1R corresponding to the second emission area PXA-R of the second pixel PX-R, and a third sub-opening OP1B corresponding to the third emission area PXA-B of the third pixel PX-B. The first sub-opening OP1G may have a shape and size corresponding to the first emission area PXA-G, and the second sub-opening OP1R may have a shape and size corresponding to the second emission area PXA-R, and the third sub-opening OP1B may have a shape and a size corresponding to the third emission area PXA-B. Thus, as an example of the present invention, the first to third sub-openings OP1G, OP1R, and OP1B may have different sizes.

A plurality of first inclined surfaces OL1-S defining the first openings OP1G, OP1R, and OP1B may be provided in the first organic insulating layer OL1. The plurality of first inclined surfaces OL1-S may have a shape that is inclined with respect to a top surface of the second inorganic insulating layer IL2 and may have a second height h2 measured from the second inorganic insulating layer IL2.

A second organic insulating layer OL2 may be disposed on the first inclined surfaces OL1-S of the first organic insulating layer OL1. For example, the second organic insulating layer OL2 may cover the first inclined surfaces OL1-S without covering the top surface of the first organic insulating layer OL1.

The second organic insulating layer OL2 may include an organic insulating material. Particularly, the second organic insulating layer OL2 may be made of an organic insulating material having a refractive index that is greater than that of the first organic insulating layer OL1.

In the second organic insulating layer OL2, a plurality of second openings OP2R, and OP2B may be defined in areas corresponding to some of the openings OP1R and OP1B among the plurality of first openings OP1G, OP1R, and OP1B. Each of the second openings OP2R and OP2B may overlap the emission areas PXA-R and PXA-B of the second and third pixels PX-R and PX-B in a plan view. As an example of the present invention, each of the second openings OP2R and OP2B may have a size that is less than that of each of the corresponding first openings OP1R and OP1B.

The second openings OP2R and OP2B may include a fifth sub-opening OP2R corresponding to the second emission area PXA-R of the second pixel PX-R and a sixth sub-opening OP2B corresponding to the third emission area PXA-B of the third pixel PX-B. The fifth sub-opening OP2R may have a shape and a size corresponding to the second emission area PXA-R, and the sixth sub-opening OP2B may have a shape and a size corresponding to the third emission area PXA-B. For example, the fifth and sixth sub-openings OP2R and OP2B may have different sizes.

Also, the fifth sub-opening OP2R corresponds to the second sub-opening OP1R, and the sixth sub-opening OP2B corresponds to the third sub-opening OP1B. Here, the fifth sub-opening OP2R has a size that is less than that of the second sub-opening OP1R, and the sixth sub-opening OP2B has a size that is less than that of the third sub-opening OP1B.

A plurality of second inclined surfaces OL2-S defining the second openings OP2R and OP2B may be provided in the second organic insulating layer OL2. Each of the plurality of second inclined surfaces OL2-S may have a shape that is inclined with respect to the top surface of the second inorganic insulating layer IL2. Here, each of the second inclined surfaces OL2-S may have the same height as the first inclined surfaces OL1-S.

The second organic insulating layer OL2 may cover the first inclined surfaces OL1-S without covering the top surface of the first organic insulating layer OL1. The plurality of second inclined surfaces OL2-S may be provider in parallel to the first inclined surfaces OL1-S, and the plurality of second inclined surfaces OL2-S may be spaced apart from the plurality of first inclined surfaces OL1-S in a plan view.

A third organic insulating layer OL3 may be disposed on the second inclined surfaces OL2-S of the second organic insulating layer OL2. For example, the third organic insulating layer OL3 may cover the second inclined surfaces OL2-S without covering the top surface of the first organic insulating layer OL1.

In the third organic insulating layer OL3, a plurality of third openings OP3B may be defined in areas corresponding to some of the openings OP2B among the plurality of first openings OP2R and OP2B. Each of the third openings OP3B may overlap the third emission area PXA-B of the third pixel PX-B in a plan view. As an example of the present invention, each of the third openings OP3B may have a size that is less than that of each of the corresponding second openings OP2B.

The third opening OP3B may have a shape and a size corresponding to the third emission area PXA-B. Also, the third opening OP3B corresponds to the sixth sub-opening OP2B and has a size that is less than that of the sixth sub-opening OP2B.

A plurality of third inclined surfaces OL3-S defining the third openings OPS B may be provided in the third organic insulating layer OL3. Each of the plurality of third inclined surfaces OL3-S may have a shape that is inclined with respect to the top surface of the second inorganic insulating layer IL2. Here, each of the third inclined surfaces OL3-S may have the same height as each of the first and second inclined surfaces OL1-S and OL2-S.

The third organic insulating layer OL3 may cover the second inclined surfaces OL2-S without covering the top surface of the second organic insulating layer OL2. The plurality of third inclined surfaces OL3-S may be provided in parallel to the second inclined surfaces OL2-S, and the plurality of third inclined surfaces OL3-S may be spaced apart from the plurality of second inclined surfaces OL2-S, in a plan view.

FIGS. 10 and 11 illustrate a structure in which the number of inclined surfaces provided in each of the pixel PX-G, PX-R, and PX-B is different from each other. For example, one inclined surface OL1-S may be provided in the first pixel PX-G, and two inclined surfaces OL1-S and OL2-S may be provided in the second pixel PX-R, and three inclined surfaces OL1-S, OL2-S, and OL3-S may be provided in the three pixel PX-B. However, the embodiment of the present invention is not necessarily limited thereto. For example, the number of inclined surfaces provided to the first pixel PX-G may lie greater than the number of inclined surfaces provided to the second and third pixels PX-R and PX-B.

FIG. 2 is a cross-sectional view illustrating a partial configuration of the display device according to an embodiment of the present invention.

Figure 12:
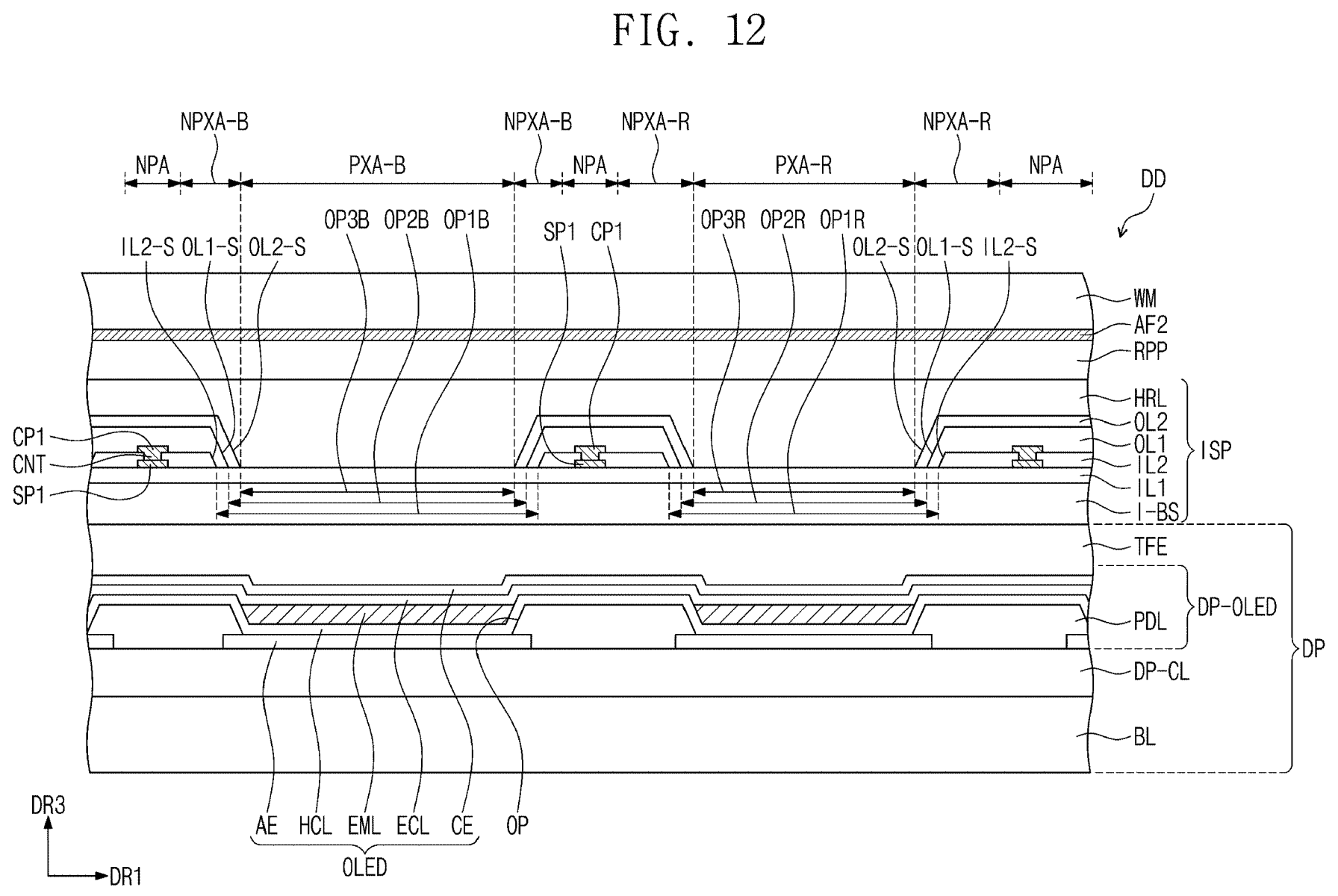

Referring to FIG. 12, in the display device DD, according to an embodiment of the present invention, a plurality of first openings OP1G, OP1R, and OP1B may be defined in the second inorganic insulating layer IL2. The first openings OP1G, OP1R, and OP1B may be formed together with a contact hole CNT partially exposing the first sensing part SP1 in the second inorganic insulating layer IL2. For example, the contact hole CNT and the first openings OP1G, OP1R, and OP1B may be formed in the second inorganic insulating layer IL2 through a single mask process.

The first openings OP1G, OP1R, and OP1B may correspond to the emission areas PXA-G, PXA-R, and PXA-B of the pixels PX-G, PX-R, and PX-B, respectively. The first openings OP1G, OP1R, and OP1B may overlap the emission areas PXA-G, PXA-R, and PXA-B of the pixels PX-G, PX-R, and PX-B in a plan view, respectively. The first openings OP1G, OP1R, and OP1B may have different sizes.

A plurality of first inclined surfaces IL2-S defining the first openings OP1G, OP1R, and OP1B may be provided in the second inorganic insulating layer IL2. Each of the plurality of first inclined surfaces IL2-S may have a shape that is inclined with respect to the top surface of the first inorganic insulating layer IL1. Here, the second inorganic insulating layer IL2 may have a first refractive index.

A first organic insulating layer OL1 may be disposed on the second inorganic insulating layer IL2. The first organic insulating layer OL1 may include an organic insulating material. The organic insulating material may include an acrylic-based resin, a methacrylic-based resin, a polyiso-prene-based resin, a vinyl-based resin, an epoxy-based resin, a urethane-based resin, a cellulose-based resin, a siloxane-based resin, a polyimide-based resin, a polyamide-based resin, and/or a perylene-based resin. However, this is merely an example, and the organic insulating material is not necessarily limited to the above example. The first organic insulating layer OL1 may be made of an organic insulating material having a refractive index that is greater than that of the second inorganic insulating layer IL2.

A plurality of second openings OP2G, OP2R, and OP2B may be defined in areas corresponding to the plurality of first openings OP1G, OP1R, and OP1B in the first organic insulating layer OL1, respectively. The second openings OP2G, OP2R, and OP2B may overlap the emission areas PXA-G, PXA-R, and PXA-B of each pixel PX-G, PX-R, and PX-B in a plan view, respectively. As an example of the present invention, each of the second openings OP2G, OP2R, and OP2B may have a size that is less than that of each of the corresponding first openings OP1G, OP1R, and OP1B.

A plurality of second inclined surfaces OL1-S defining the second openings OP2G, OP2R, and OP2B may be provided in the first organic insulating layer OL1. Each of the plurality of second inclined surfaces OL1-S may have a shape that is inclined with respect to the top surface of the first inorganic insulating layer IL1.

The first organic insulating layer OL1 may cover a top surface of the second inorganic insulating layer IL2 and the plurality of first inclined surfaces IL2-S. Thus, each of the second inclined surfaces OL1-S may have a height that is greater than that of the first inclined surfaces IL2-S. Also, the plurality of second inclined surfaces OL1-S may be spaced apart from the plurality of first inclined surfaces IL2-S in a plan view. For example, each of the plurality of second inclined surfaces OL1-S may be disposed closer to the corresponding emission area PXA-B than the corresponding first inclined surface IL2-S.

A second organic insulating layer OL2 may be disposed on the first organic insulating layer OL1. The second organic insulating layer OL2 may include organic insulating material. The second organic insulating layer OL2 may be made of an organic insulating material having a refractive index that is greater than that of the first organic insulating layer OL1.

In the second organic insulating layer OL2, a plurality of third openings OP3G, OP3R and OP3B may be defined in areas corresponding to the plurality of second openings OP2G, OP2R, and OP2B, respectively. The third openings OP3G, OP3R, and OP3B may overlap the emission areas PXA-G, PXA-R, and PXA-B of the pixels PX-G, PX-R, and PX-B in a plan view, respectively. As an example of the present invention, each of the third openings OP3G, OP3R, and OP3B may have a size that is less than that of each of the corresponding, second openings OP2G, OP2R, and OP2B.

A plurality of third inclined surfaces OL2-S defining the third openings OP3G, OP3R, and OP3B ma be provided in the second organic insulating layer OL2. Each of the plurality of third inclined surfaces OL2-S may have a shape that is inclined with respect to the top surface of the first inorganic insulating layer IL1.

The second organic insulating layer OL2 may cover a top surface of the first organic insulating layer OL1 and the plurality of second inclined surfaces OL1-S. Thus, each of the third inclined surfaces OL2-S may have a height that is greater than that of each of the second inclined surfaces OL1-S. Also, the plurality of third inclined surfaces OL2-S may be spaced apart from the plurality of second inclined surfaces OL1-S in a plan view. For example, each of the plurality of third inclined surfaces OL2-S may be disposed closer to the corresponding emission area PXA-B than the corresponding second inclined surface OL1-S.

A high refractive insulating layer HRL may be disposed on the second organic insulating layer OL2. The high refractive insulating layer HRL may have a refractive index that is greater that of the second organic insulating OL2. As an example of the present invention, the high refractive insulating layer HRL may have a refractive index of 1.65 or more and 1.70 or less. The high refractive insulating layer HRL may include an organic insula ng material having a refractive index that is greater than that of the organic insulating material forming the second organic insulating layer OL2. The high refractive layer HRL may fill the third openings OP3G, OP3R, and OP3B. The high refractive insulating layer HRL may have a flat top surface.

As described above, in each of the pixels PX-G, PX-R, and PX-B, openings may be formed in insulating layers having different refractive indexes, and inclined surfaces for reflecting side light due to a difference in refractive indexes may be formed. Thus, a light path of the side light emitted from the light emitting element OLED may be changed in the frontward direction by the inclined surfaces IL2-S, OL1-S, and OL2-S, and as a result, light efficiency of the display device DD may be increased.

Figure 13:
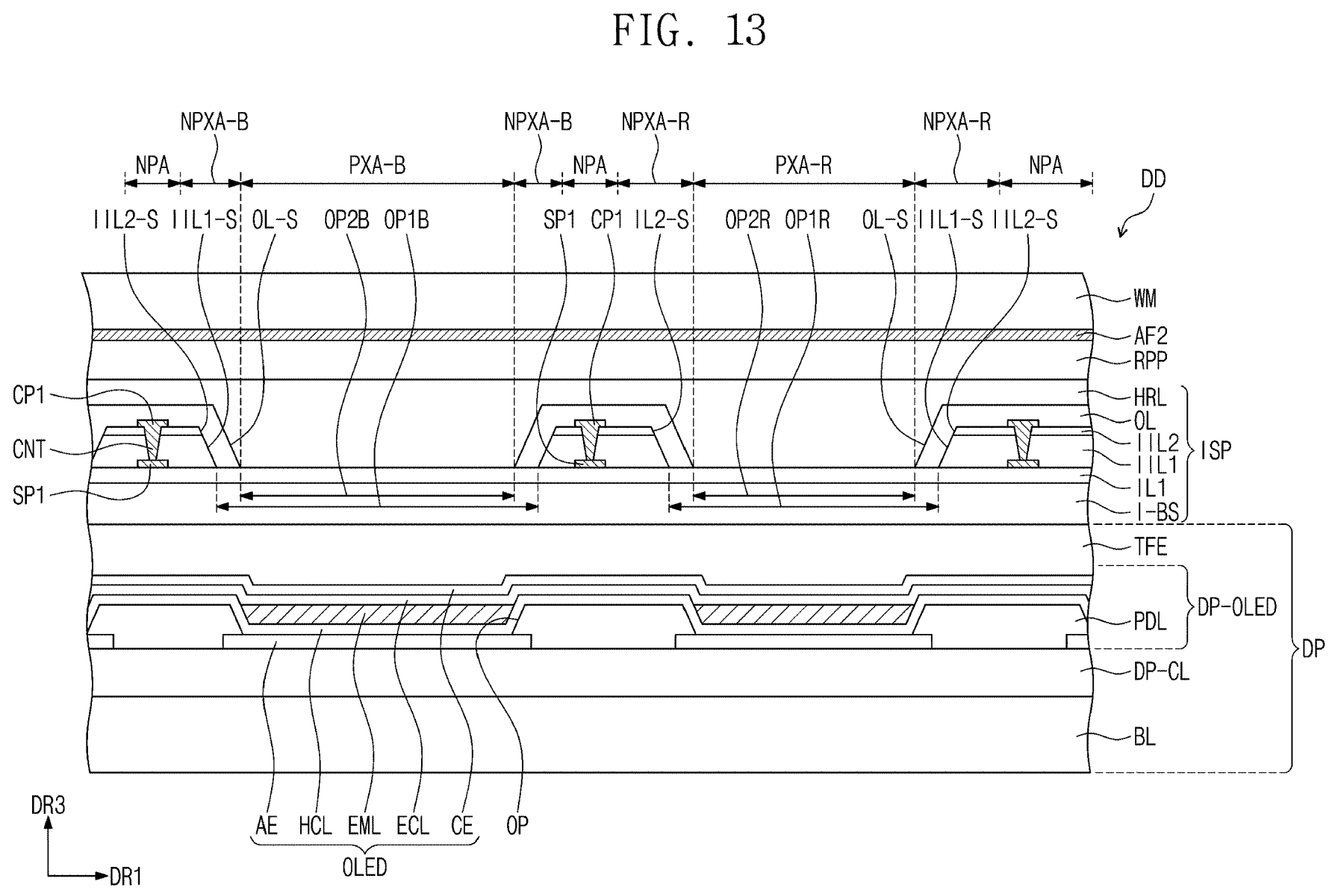

FIG. 13 is a cross-sectional view illustrating a partial configuration of the display device according to an embodiment if the presents invention.

Referring to FIG. 13, its the display deice DD according to an embodiment of the present invention, the input sensing unit ISP may include first and second interlayer insulating layers IIL1 and IIL2 disposed between the first and second conductive layers SP1 and CP1. For example, the first interlayer insulating layer IIL1 may be disposed on the first conductive layer SP1, and the second interlayer insulating layer IIL2 may be disposed on the first interlayer insulating layer IIL1.

The first and second interlayer insulating layers IIL1 and IIL2 space and separate the first conductive layer SP1 from the second conductive layer CP1 on the cross section. A contact hole CNT for partially exposing the first sensing pan SP1 may be provided in the first and second interlayer insulating layers IIL1 and IIL2, and the first connection part CP1 may be connected to the first sensing part SP1 through the contact hole CNT.

The first interlayer insulating layer IIL1 may have a first refractive index, and the first interlayer insulating layer IIL1 may include an organic insulating material. The second interlayer insulating layer IIL2 may include an inorganic insulating material.

A plurality of first openings OP1G, OP1R, and OP1B may be defined in the first and second interlayer insulating layers IIL1 and IIL2. The first openings OP1G, OP1R, and OP1B may correspond to the emission areas PXA-G, PXA-R, and PXA-B of the pixels PX-G, PX-R, and PX-B, respectively. The first openings OP1G, OP1R, and OP1B may overlap the emission areas PXA-G, PXA-R, and PXA-B of the pixels PX-G, PX-R, and PX-B in a plan view, respectively. The first openings OP1G, OP1R, and OP1B may have different sizes.

A plurality of first inclined surfaces IIL1-S defining the first openings OP1G, OP1R, and OP1B may be provided in the first interlayer insulating layer IIL1, and a plurality of second inclined surfaces IIL2-S defining the first openings OP1G, OP1R, and OP1B may be provided in the second interlayer insulating layer IIL2. Each of the plurality of first and second inclined surfaces IIL1-S and IIL2-S may have a shape that is inclined with respect to the top surface of the first inorganic insulating layer IL1.

The first openings OP1G, OP1R, and OP1B may be formed together with a contact hole CNT for partially exposing the first sensing part SP1 to the first and second interlayer insulating layers IIL1 and IIL2. For example, the contact hole CNT and the first openings OP1G, OP1R, and OP1B may be formed in the first and second interlayer insulating layers IIL1 and IIL2 through a single mask process.

The second conductive layer CP2 may be disposed on the second interlayer insulating layer IIL2, and the organic insulating layer OL may be disposed on the second conductive layer CP2. The organic insulating layer OL may have a second refractive index. The organic insulating layer OL may include an organic insulating material. The organic insulating layer OL may have a refractive index that is greater than that of each of the first and second interlayer insulating layers IIL1 and IIL2.

In the organic insulating layer OL, a plurality of second openings OP2G, OP2R, and OP2B may be defined in areas corresponding to the plurality of first openings OP1G, OP1R, and OP1B, respectively. The second openings OP2G, OP2R, and OP2B may overlap the emission areas PXA-G, PXA-R, and PXA-B of each pixel PX-G, PX-R, and PX-B in plan view, respectively. As an example of the present invention, each of the second openings OP2G, OP2R, and OP2B may have a size that is less than that of each of the corresponding first openings OP1G, OP1R, and OP1B.

A plurality of third inclined surfaces OL-S defining the second openings OP2G, OP2R, and OP2B may be provided in the organic insulating layer OL. Each of the plurality of third inclined surfaces OL-S has a shape that is inclined with respect to the top surface of the first inorganic insulating layer IL1.

The organic insulating layer OL may cover the top surface of the second interlayer insulating layer IIL2 and the plurality of first and second inclined surfaces IIL1-S and IIL2-S of the first and second interlayer insulating layers. Thus, each of the third inclined surfaces OL-S may have a height that is greater than the sum of the first and second inclined surfaces IIL1-S and IIL2-S. In addition, each of the plurality of third inclined surfaces OL-S may be disposed closer to the corresponding emission area PXA-B than each of the corresponding first and second inclined surfaces IIL1-S and IIL2-S.

In FIGS. 12 and 13, openings for providing the inclined surfaces to the insulating layers IL2, IIL1, and IIL2 disposed between the first and second conductive layers SP1 and CP2 may be formed together during the process of forming the contact hole CNT to reduce the number of masks compared to the embodiment illustrated in FIGS. 6 to 11.

It will be apparent to those skilled in the art that various modifications and deviations can be made in the present invention. Thus, it is intended that the present invention covers the modifications and deviations of this invention provided they come within the scope of the present disclosure. Accordingly, the technical scope of the present invention should not necessarily be limited to the contents described in the detailed description of the specification.

The invention claimed is:

1. A display device, comprising:
a display panel comprising a plurality of emission areas and a non-emission area defined between emission areas of the plurality of emission areas;
a first insulating layer disposed on the display panel and having a first refractive index and a plurality of first openings defined in an area overlapping the plurality of emission areas;
a second insulating layer having a second refractive index and a plurality of second openings defined in an area corresponding to the plurality of first openings; and
a high refractive insulating layer disposed on the first and second insulating layers, overlapping the plurality of emission areas, and having a third refractive index that is greater than each of the first and second refractive indexes,
wherein the first insulating layer comprises a first inclined surface that defines the plurality of first openings, and the second insulating layer comprises a second inclined surface that defines the plurality of second openings,
wherein the first inclined surface and the second inclined surface are spaced apart from each other,
wherein the first inclined surface of the first insulating layer is fully covered by the second insulating layer, and
wherein the first and second inclined surfaces are completely disposed on the non-emission area without extending into the emission areas.

2. The display device of claim 1, wherein the second insulating layer is disposed on the first insulating layer and covers a top surface of the first insulating layer and the first inclined surface of the first insulating layer.

3. The display device of claim 2, wherein the second refractive index is greater than the first refractive index.

4. The display device of claim 2, wherein the first inclined surface has a height that is less than a height of the second inclined surface.

5. The display device of claim 2, further comprising a third insulating layer having a fourth refractive index, the third insulating layer including a plurality of third openings defined in an area corresponding to the plurality of second openings.

6. The display device of claim 5, wherein the third insulating layer comprises a third inclined surface that defines the plurality of third openings, and
wherein the third inclined surface is spaced apart from the first and second inclined surfaces.

7. The display device of claim 6, wherein the third insulating layer covers a top surface of the second insulating layer and the second inclined surface.

8. The display device of claim 7, wherein the fourth refractive index is greater than the second refractive index, the second refractive index is greater than the first refractive index, and the third refractive index is greater than the fourth refractive index.

9. The display device of claim 7, wherein the third inclined surface has a height that is greater than a height of each of the first and second inclined surfaces.

10. The display device of claim 1, wherein the second insulation layer covers the first inclined surface of the first insulating layer and does not cover a top surface of the first insulating layer, and
wherein a height of the first inclined surface is equal to a height of the second inclined surface.

11. The display device of claim 10, wherein the second refractive index is greater than the first refractive index.

12. The display device of claim 10, further comprising a third insulating layer having a fourth refractive index, wherein a plurality of third openings are defined in an area corresponding to the plurality of second openings.

13. The display device of claim 12, wherein the third insulation layer covers the second inclined surface of the second insulating layer and does not cover a top surface of each of the first and second insulating layers, and
wherein a height of the third inclined surface is equal to a height of each of the first and second inclined surfaces.

14. The display device of claim 13, wherein the fourth refractive index is greater than the second refractive index, the second refractive index is greater than the first refractive index, and the third refractive index is greater than the fourth refractive index.

15. The display device of claim 1, wherein each of the plurality of first openings has a size that is greater than that of each of the plurality of second openings.

16. The display device of claim 15, wherein the high refractive insulating layer fills each of the plurality of second openings.

17. The display device of claim 1, further comprising:
a first conductive layer disposed on the display panel; and
a second conductive layer disposed on the first conductive layer.

18. The display device of claim 17, further comprising an interlayer insulating layer disposed between the first conductive layer and the second conductive layer,
wherein the first insulating layer is disposed on the second conductive layer.

19. The display device of claim 18, wherein the first conductive layer comprises a connection part, the second conductive layer comprises sensor parts, a contact hole is defined in the first insulating layer, and the connection part is electrically connected to the sensor parts.

20. The display device of claim 19, wherein each of the sensor parts has a mesh shape, and the sensor parts do not overlap the plurality of emission areas.

21. The display device of claim 17, wherein the first insulating layer is disposed between the first conductive layer and the second conductive layer.

22. The display device of claim 19, wherein the second insulating layer is disposed on the second conductive layer and covers the second conductive layer.

23. The display device of claim 1, wherein each of the first insulating layer, the second insulating layer, and the high refractive insulating layer comprises an organic insulating material.

24. An electronic device, comprising:
a display panel comprising a plurality of emission areas and a non-emission area defined between emission areas of the plurality of emission areas;
a first insulating layer disposed on the display panel and having a first refractive index and a plurality of first openings defined in an area overlapping the plurality of emission areas;
a second insulating layer having a second refractive index and a plurality of second openings defined in an area corresponding to the plurality of first openings; and
a high refractive insulating layer disposed on the first and second insulating layers, overlapping the plurality of emission areas, and having a third refractive index that is greater than each of the first and second refractive indexes,
wherein the first insulating layer comprises a first inclined surface that defines the plurality of first openings, and the second insulating layer comprises a second inclined surface that defines the plurality of second openings,
wherein the first inclined surface and the second inclined surface are spaced apart from each other,
wherein the second insulating layer is disposed on the first insulating layer and covers a top surface of the first insulating layer and the first inclined surface of the first insulating layer, and
wherein the first inclined surface has a height that is less than a height of the second inclined surface.

* * * * *